(12) United States Patent
Feng

(10) Patent No.: US 12,740,043 B2
(45) Date of Patent: Sep. 15, 2026

(54) SEMICONDUCTOR STRUCTURE AND METHOD FOR FORMING SAME

(71) Applicant: CHANGXIN MEMORY TECHNOLOGIES, INC., Hefei City (CN)

(72) Inventor: Daohuan Feng, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 396 days.

(21) Appl. No.: 18/541,118

(22) Filed: Dec. 15, 2023

(65) Prior Publication Data

US 2024/0114673 A1 Apr. 4, 2024

Related U.S. Application Data

(63) Continuation of application No. PCT/CN2023/071230, filed on Jan. 9, 2023.

(30) Foreign Application Priority Data

Sep. 5, 2022 (CN) ......................... 202211095105.0

(51) Int. Cl.
*H10B 12/00* (2023.01)

(52) U.S. Cl.
CPC ............. *H10B 12/05* (2023.02); *H10B 12/03* (2023.02); *H10B 12/488* (2023.02)

(58) Field of Classification Search
CPC ...... H10B 12/05; H10B 12/03; H10B 12/488; H10B 12/482; H10D 30/014;
(Continued)

(56) References Cited

U.S. PATENT DOCUMENTS 8,486,791 B2 7/2013 Lue
8,599,616 B2 12/2013 Roizin
(Continued)

FOREIGN PATENT DOCUMENTS

CN 102610576 A 7/2012
CN 109616474 A 4/2019
(Continued)

OTHER PUBLICATIONS

International Search Report in the international application No. PCT/CN2023/071230, mailed on May 10, 2023, 3 pages.
(Continued)

*Primary Examiner* — Tong-Ho Kim
(74) *Attorney, Agent, or Firm* — Syncoda LLC; Feng Ma

(57) ABSTRACT

Provided are a semiconductor structure and a method for forming the same. The method for forming a semiconductor structure includes the following operations. A stack is formed on a substrate. The stack includes interlayer insulating layers and sacrifice layers alternately stacked in a first direction. The stack includes a plurality of storage regions arranged at intervals in a second direction. Part of the sacrifice layers of storage regions is removed to form first trenches between adjacent interlayer insulating layers. Transistor structures are formed in the first trenches. The transistor structures include gate layers covering inner walls of the first trenches and active structures located in the gate layers. A word line extending in the second direction is formed. The word line envelops gate layers of the plurality of storage regions arranged at intervals in the second direction.

16 Claims, 21 Drawing Sheets

(58) Field of Classification Search
CPC ........... H10D 30/6735; H10D 30/6757; H10D 1/714; H10D 64/01; H10D 64/512; H10W 20/0698; H10W 70/611; H10W 70/65
USPC .......................................................... 257/306
See application file for complete search history.

(56) References Cited

U.S. PATENT DOCUMENTS

| | | | | |
|---|---|---|---|---|
| 10,535,659 | B2 | 1/2020 | Kim | |
| 10,861,854 | B2 | 12/2020 | Kim | |
| 11,367,726 | B2 | 6/2022 | Lee | |
| 11,532,630 | B2 | 12/2022 | Karda | |
| 11,587,930 | B2 | 2/2023 | Kang | |
| 11,616,065 | B2 | 3/2023 | Kim | |
| 2012/0181654 | A1 | 7/2012 | Lue | |
| 2013/0051150 | A1 | 2/2013 | Roizin | |
| 2019/0103407 | A1 | 4/2019 | Kim | |
| 2020/0111793 | A1 | 4/2020 | Kim | |
| 2021/0057416 | A1 | 2/2021 | Kim | |
| 2021/0183862 | A1* | 6/2021 | Son | H10B 12/30 |
| 2021/0249415 | A1 | 8/2021 | Kang | |
| 2022/0005809 | A1* | 1/2022 | Kim | H10D 62/121 |
| 2022/0068927 | A1 | 3/2022 | Karda | |
| 2022/0130834 | A1* | 4/2022 | Lee | H10B 12/05 |
| 2022/0320103 | A1 | 10/2022 | Lee | |

FOREIGN PATENT DOCUMENTS

| | | | |
|---|---|---|---|
| CN | 112992902 | A | 6/2021 |
| CN | 114121819 | A | 3/2022 |

OTHER PUBLICATIONS

1 Extended European Search Report in application No. 23821862.2, mailed on Nov. 20, 2024.

* cited by examiner

SEMICONDUCTOR STRUCTURE AND METHOD FOR FORMING SAME

CROSS-REFERENCE TO RELATED APPLICATION(S)

This application is continuation of international application PCT/CN2023/071230, filed on Jan. 9, 2023, which claims priority to Chinese Patent Application No. 202211095105.0, filed on Sep. 5, 2022 and entitled "SEMICONDUCTOR STRUCTURE AND METHOD FOR FORMING SAME". The contents of international application PCT/CN2023/071230 and Chinese Patent Application No. 202211095105.0 are hereby incorporated by reference in their entireties.

BACKGROUND

The disclosure relates to, but is not limited to, a semiconductor structure and a method for forming the same.

A dynamic random access memory (DRAM) is a semiconductor device commonly used in electronic devices such as computers. It consists of a plurality of memory units, each of which usually includes a transistor and a capacitor. The transistor has a gate electrically connected to a word line, a source electrically connected to a bit line, and a drain electrically connected to the capacitor. The word line voltage on the word line can control the turn-on and turn-off of the transistor, so that data information stored in the capacitor can be read or data information can be written into the capacitor, via the bit line.

In order to satisfy the requirements of continuous miniaturization of semiconductor structures such as the DRAM and the continuous improvement of the data storage capacity, a semiconductor structure such as a DRAM having a three-dimensional structure came into being. In the course of manufacturing the semiconductor structure such as the DRAM having the three-dimensional structure, the main method is to form a stack by means of an epitaxial process, and then to process the stack to form a three-dimensional stacked structure. However, the epitaxial growth process is complex, and stress and other defects are prone to appear in the stack, which not only increases the manufacturing cost of the semiconductor structure, but also reduces the performance of semiconductor structure and the manufacturing yield.

Therefore, there is a need to simplify the manufacturing process of the semiconductor structure, reduce the manufacturing cost of the semiconductor structure, and improve the performance of the semiconductor structure and the manufacturing yield.

SUMMARY

Some embodiments of the disclosure provide a semiconductor structure and a method for forming the same, so as to simplify the manufacturing process of the semiconductor structure, reduce the manufacturing cost of the semiconductor structure, and improve the performance of the semiconductor structure and manufacturing yield.

According to some embodiments, the disclosure provides a method for forming a semiconductor structure, which includes the following operations.

A stack is formed on a substrate. The stack includes interlayer insulating layers and sacrifice layers alternately stacked in a first direction. The stack includes a plurality of storage regions arranged at intervals in a second direction.

The first direction is perpendicular to a top surface of the substrate, and the second direction is parallel to the top surface of the substrate.

Part of the sacrifice layers of storage regions is removed to form first trenches located between adjacent interlayer insulating layers.

Transistor structures are formed in the first trenches. The transistor structures include gate layers covering inner walls of the first trenches and active structures located in the gate layers.

A word line extending in the second direction is formed. The word line envelops gate layers of the plurality of storage regions arranged at intervals in the second direction.

According to other embodiments, the disclosure further provides a semiconductor structure including a substrate, a stacked structure and a word line.

The stacked structure is located on the substrate. The stacked structure includes a plurality of memory units arranged at intervals in a first direction and in a second direction, and interlayer insulating layers located between adjacent memory units in the first direction. The memory units include transistor structures, the transistor structures include active structures, and gate layers distributed around peripheries of the active structures. The first direction is perpendicular to a top surface of the substrate. The second direction is parallel to the top surface of the substrate.

The word line extends in the second direction, and the word line envelops gate layers of a plurality of memory units arranged at intervals in the second direction.

DETAILED DESCRIPTION

Embodiments of a semiconductor structure and a method for forming the same provided in the disclosure will be described in detail below with reference to the accompanying drawings.

Figure 1:
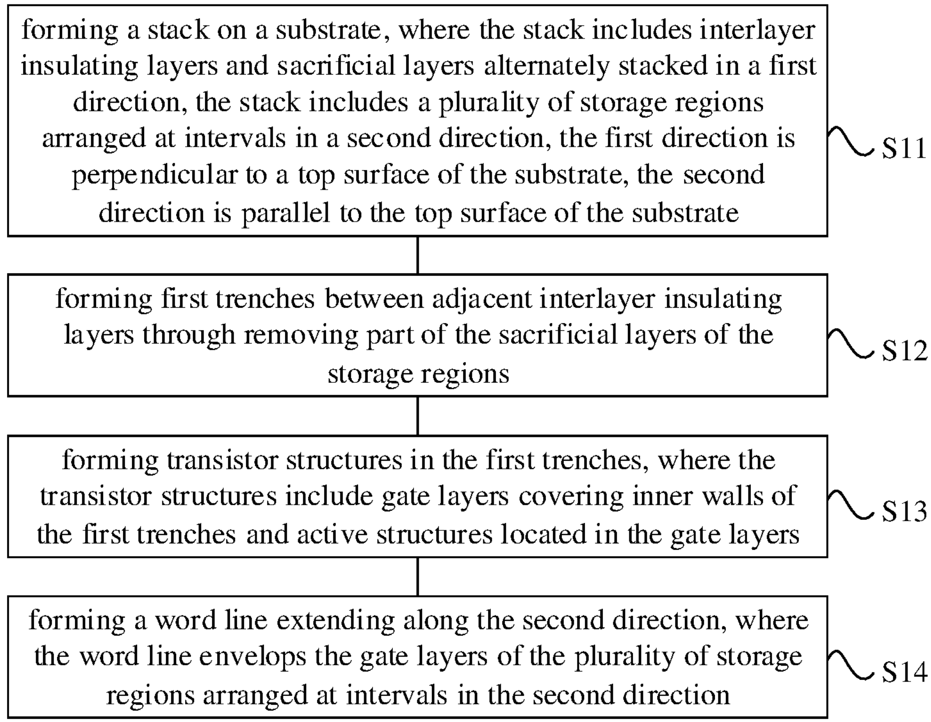
FIG. 1 is a flowchart of a method for forming a semiconductor structure in an embodiment of the disclosure.
Figure 2:
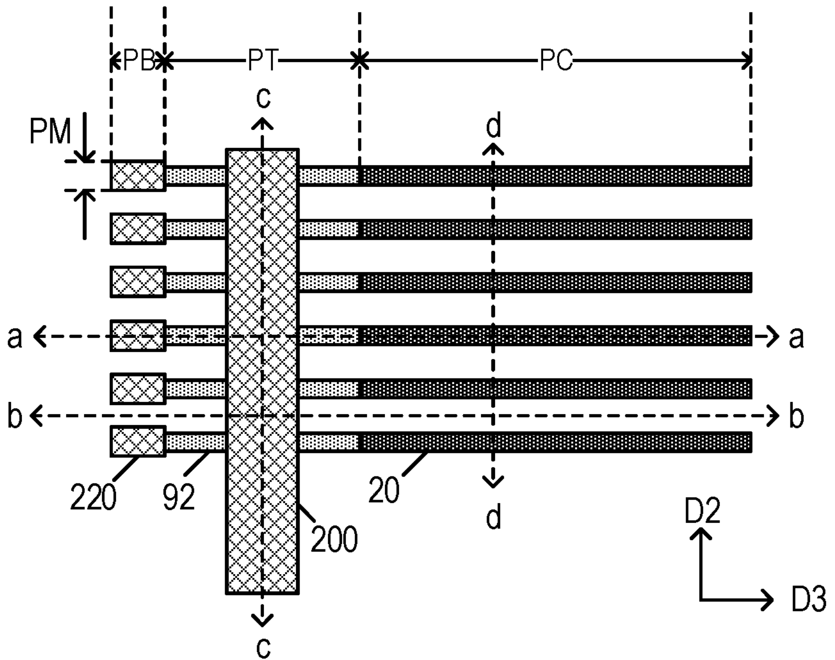
FIG. 2 to FIG. 22 are schematic structural diagrams corresponding to main operations during forming a semiconductor structure in an embodiment of the disclosure.

The embodiments provide a semiconductor structure. FIG. 1 is a flowchart of a method for forming a semiconductor structure in an embodiment of the disclosure. FIG. 2 to FIG. 22 are schematic structural diagrams corresponding to main operations during forming a semiconductor structure in an embodiment of the disclosure. FIG. 2 is a top view diagram of the semiconductor structure formed in the embodiment. FIG. 3 to FIG. 22 are schematic structural diagrams at a-a position, b-b position, c-c position and d-d position of FIG. 2 and corresponding to the main operations during forming a semiconductor structure in the embodiments of the disclosure, so as to clearly illustrate the method for forming a semiconductor structure. As shown in FIG. 1 to FIG. 22, the method for forming a semiconductor structure includes the following operations.

Figure 3:
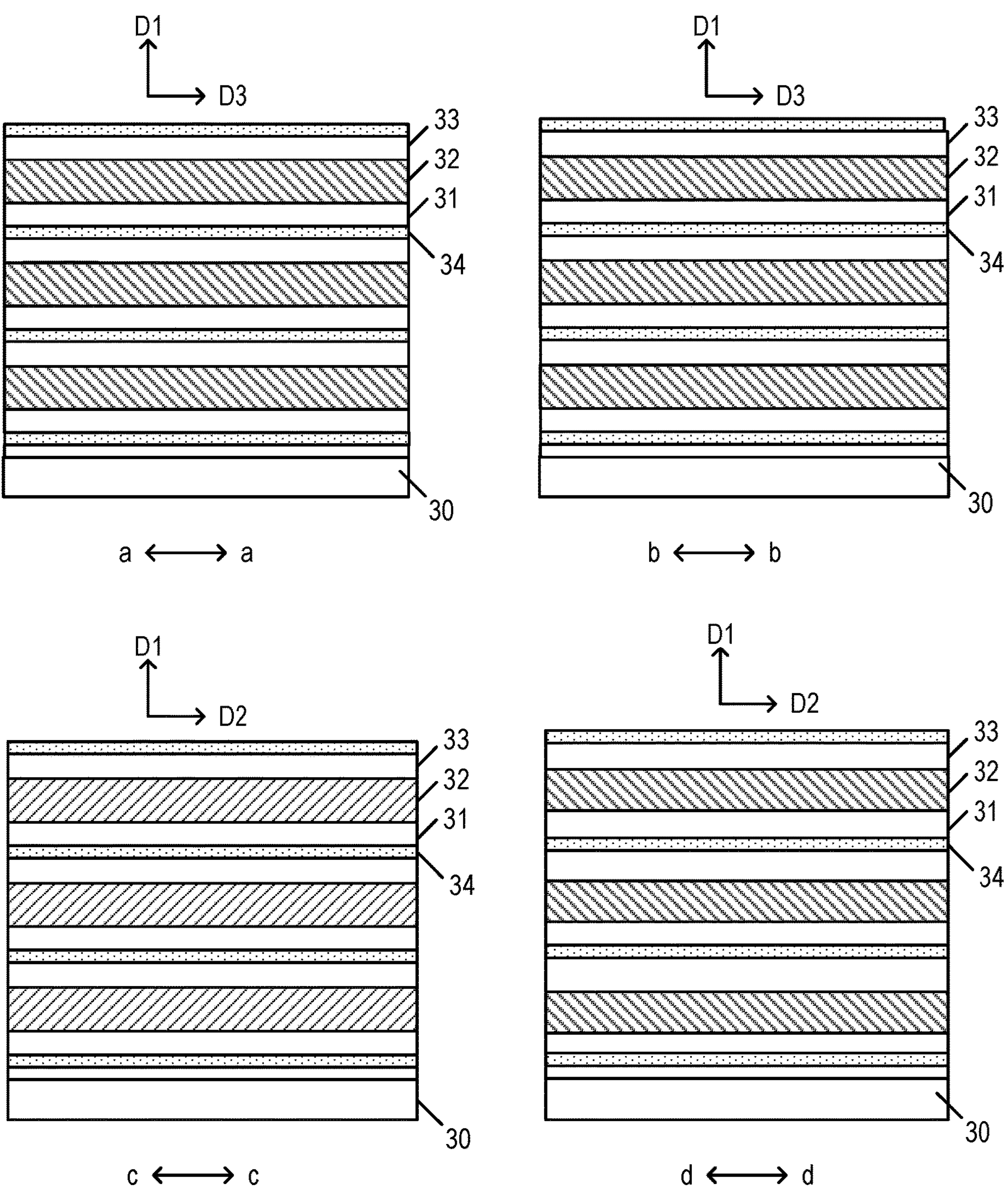

At S11, as shown in FIG. 2 and FIG. 3, a stack is formed on a substrate 30. The stack includes interlayer insulating layers 34 and sacrifice layers alternately stacked in a first direction D1. The stack includes a plurality of storage regions PM arranged at intervals in a second direction D2. The first direction D1 is perpendicular to a top surface of the substrate 30, and the second direction D2 is parallel to the top surface of the substrate 30.

The semiconductor structure formed according to the specific embodiment may be, but is not limited to, a DRAM, and is described below by taking the semiconductor structure being the DRAM as an example. For example, the substrate 30 may be, but is not limited to, a silicon substrate. The specific embodiment is described by taking the substrate 30 being the silicon substrate as an example. In other embodiments, the substrate 30 may be a semiconductor substrate of a material such as gallium nitride, gallium arsenide, gallium carbide, silicon carbide or SOI (silicon-on-insulator). The substrate 30 is used for supporting a device structure thereon. The substrate 30 is used for supporting a device structure thereon. The sacrifice layers and the interlayer insulating layer 34 are alternately stacked in the first direction D1 on the top surface of the substrate 30 to form the stack. The stack includes a plurality of storage regions PM arranged at intervals in the second direction D2, and storage regions PM are used to form memory units. The top surface of the substrate 30 refers to the surface of the substrate 30 facing to the stack. The term "a plurality of" in the embodiments refers to two or more.

In some embodiments, the operation in which the stack is formed on the substrate 30 includes the following operations.

The substrate 30 is provided.

The interlayer insulating layers 34 and the sacrifice layers are alternately deposited on the top surface of the substrate 30 in the first direction D1. The sacrifice layers include first sacrifice layers 31, second sacrifice layers 32 and third sacrifice layers 33 that are stacked in sequence in the first direction D1.

Specifically, the sacrifice layers and the interlayer insulating layers 34 may be alternately deposited on the top surface of the substrate 30 by a chemical vapor deposition process, a physical vapor deposition process or an atomic layer deposition process. The etching selectivity ratio between the sacrifice layers and the interlayer insulating layers 34 should be high to facilitate a subsequent selective etching. The sacrifice layers may have a single-layer structure, or may have a multi-layer structure. In order to simplify the subsequent process for etching the sacrifice layers, thereby reducing the manufacturing complexity of the semiconductor structure, in an example, a sacrifice layer includes a first sacrifice layer 31, a second sacrifice layer 32 and a third sacrifice layer 33 arranged in sequence in the first direction D1. The materials of the first sacrifice layers 31 and the third sacrifice layer 33 may be same, and the material of the second sacrifice layer 32 is different from that of the first sacrifice layers 31 and that of the third sacrifice layers 33, so as to facilitate the subsequent selective etching of the first sacrifice layers 31, the second sacrifice layers 32 and the third sacrifice layers 33.

In some embodiments, the material of the first sacrifice layers 31 and the material of the third sacrifice layers 33 each are an oxide material (e.g., silicon dioxide), and the material of the second sacrifice layers 32 is a polysilicon material, so as to improve the etching selectivity ratio between the first sacrifice layers 31 (or the third sacrifice layers 33) and the second sacrifice layers 32 while reducing the manufacturing cost of the semiconductor structure.

Figure 8:
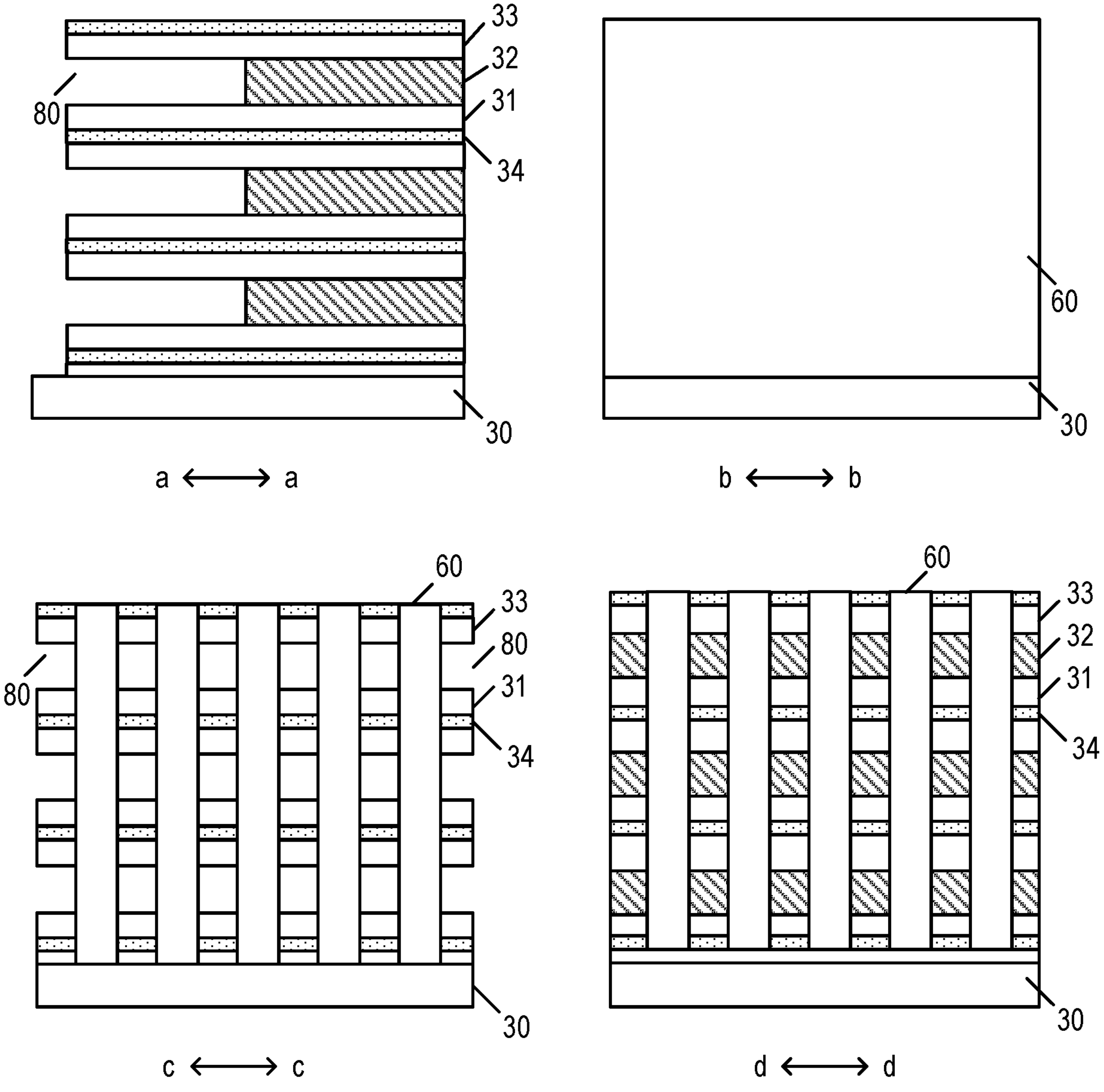

At S12, as shown in FIG. 8, part of the sacrifice layers of storage regions PM is removed to form first trenches 80 located between adjacent interlayer insulating layers 34.

In some embodiments, prior to forming the first trenches 80 located between adjacent interlayer insulating layers 34, the method further includes the following operations.

Figure 5:
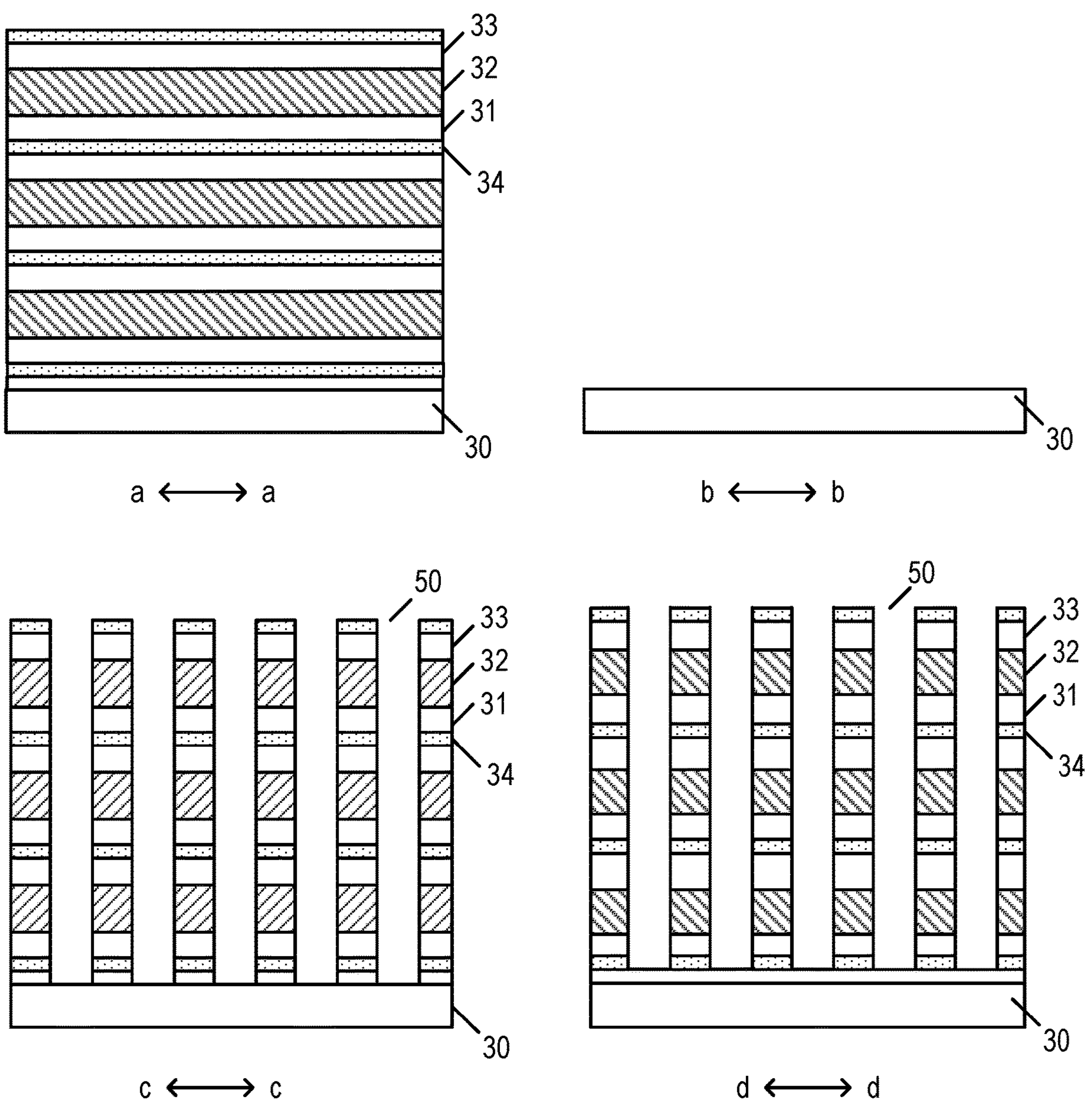

As shown in FIG. 5, the stack is etched to form isolation trenches 50 located between the storage regions PM adjacent in the second direction D2.

Figure 6:
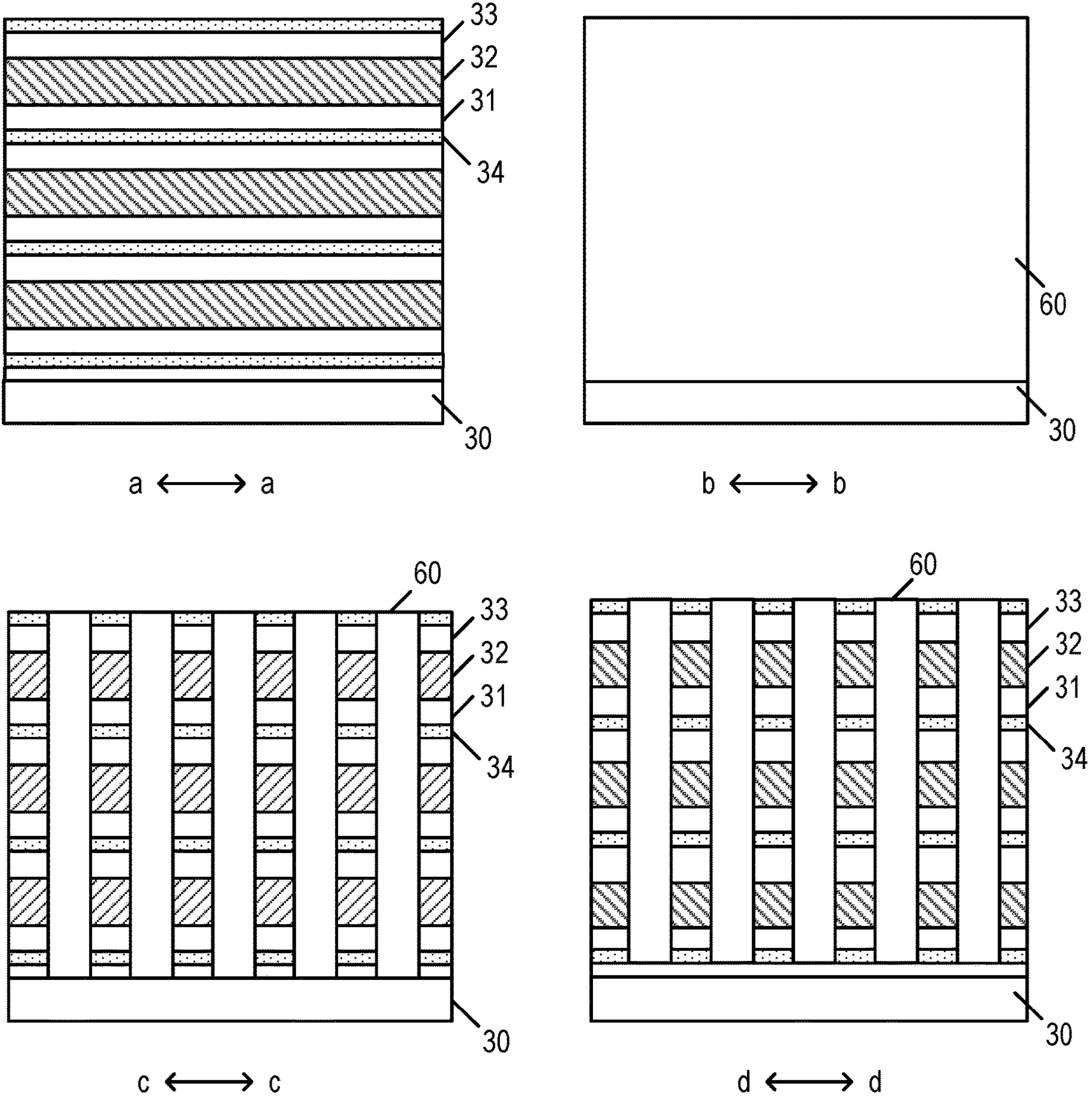

As shown in FIG. 6, an isolation layer 60 filling up the isolation trenches 50 is formed.

Figure 4:
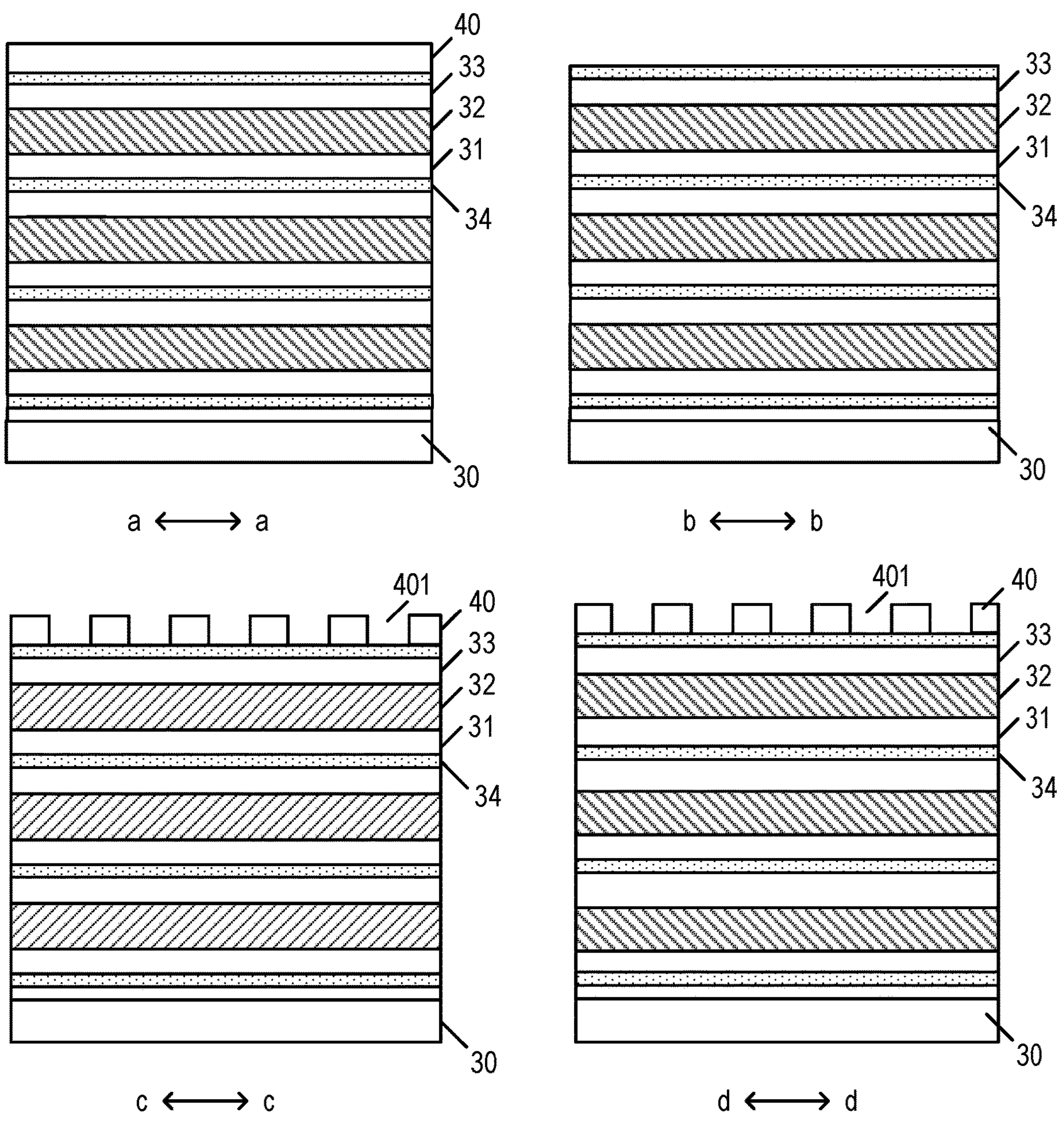

Specifically, as shown in FIG. 4, after the stack is formed, a first photoresist layer 40 is formed on the stack. The first photoresist layer 40 has first etching windows 401 exposing the stack. The positions of the first etching windows 401 align with gap regions located between the storage regions PM adjacent in the second direction D2. Then, the stack is etched downward through the first etching windows 401 to form the isolation trenches 50, which go through the stack in the first direction D1. The first photoresist layer 40 is removed to obtain the structure as shown in FIG. 5. Thereafter, as shown in FIG. 6, an insulating dielectric material such as an oxide (e.g., silicon dioxide or tetraethoxysilane (TEOS)) is deposited in the isolation trenches 50 to form the isolation layer 60 filling up the isolation trenches 50. The isolation layer 60 is used to electrically isolate storage regions PM which are adjacent in the second direction D2.

In some embodiments, the storage regions PM include transistor regions PT, and bit line regions PB located at one side of the transistor regions PT in a third direction D3. The third direction D3 is parallel to the top surface of the substrate 30, and the second direction D2 intersects with the third direction D3. The operation in which the first trenches 80 are formed between adjacent interlayer insulating layers 34 includes the following operations.

Figure 7:
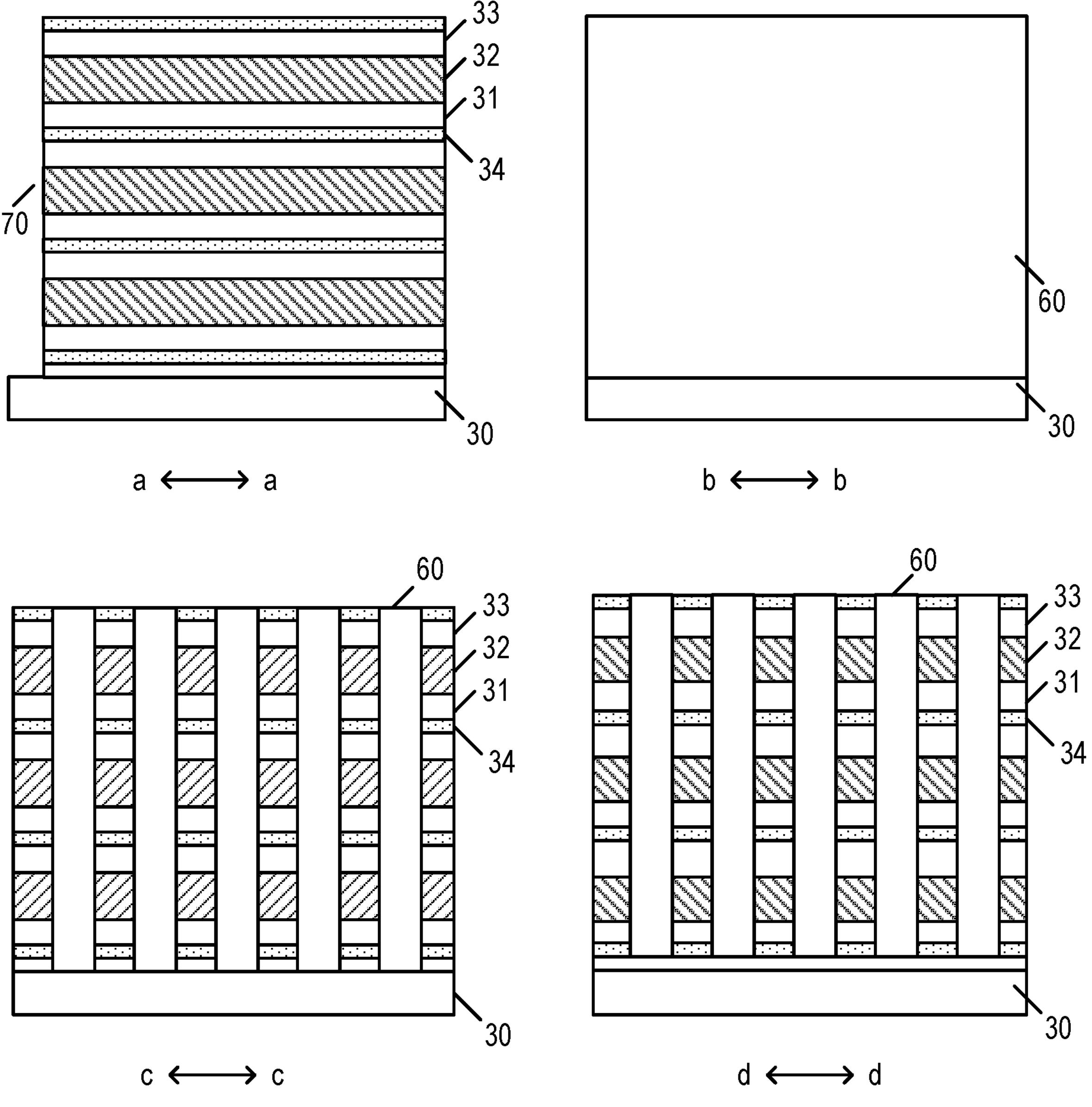

As shown in FIG. 7, the stack in the bit line regions PB is removed to form bit line trenches 70.

The second sacrifice layers 32 in the transistor regions PT are removed along the bit line trenches 70 to form the first trenches 80 located between first sacrifice layers 31 and third sacrifice layers 33 in the transistor regions PT.

Specifically, the transistor regions PT and the bit line regions PB are arranged in the third direction D3. The transistor regions PT of the storage regions PM are used to form transistor structures, and the bit line regions PT are subsequently used to form a bit line. As shown in FIG. 7, the stack in the bit line regions PB may be removed by a photolithography process to form the bit line trenches 70 exposing the substrate 30. Then, as shown in FIG. 8, all of the second sacrifice layers 32 in the transistor regions PT are removed by a lateral etching process along the bit line trenches 70 to form the first trenches 80 located between the first sacrifice layers 31 and the third sacrifice layers 33 in the transistor regions PT. The term "intersect" in the embodiments may refer to perpendicular intersection or an oblique intersection.

Figure 9:
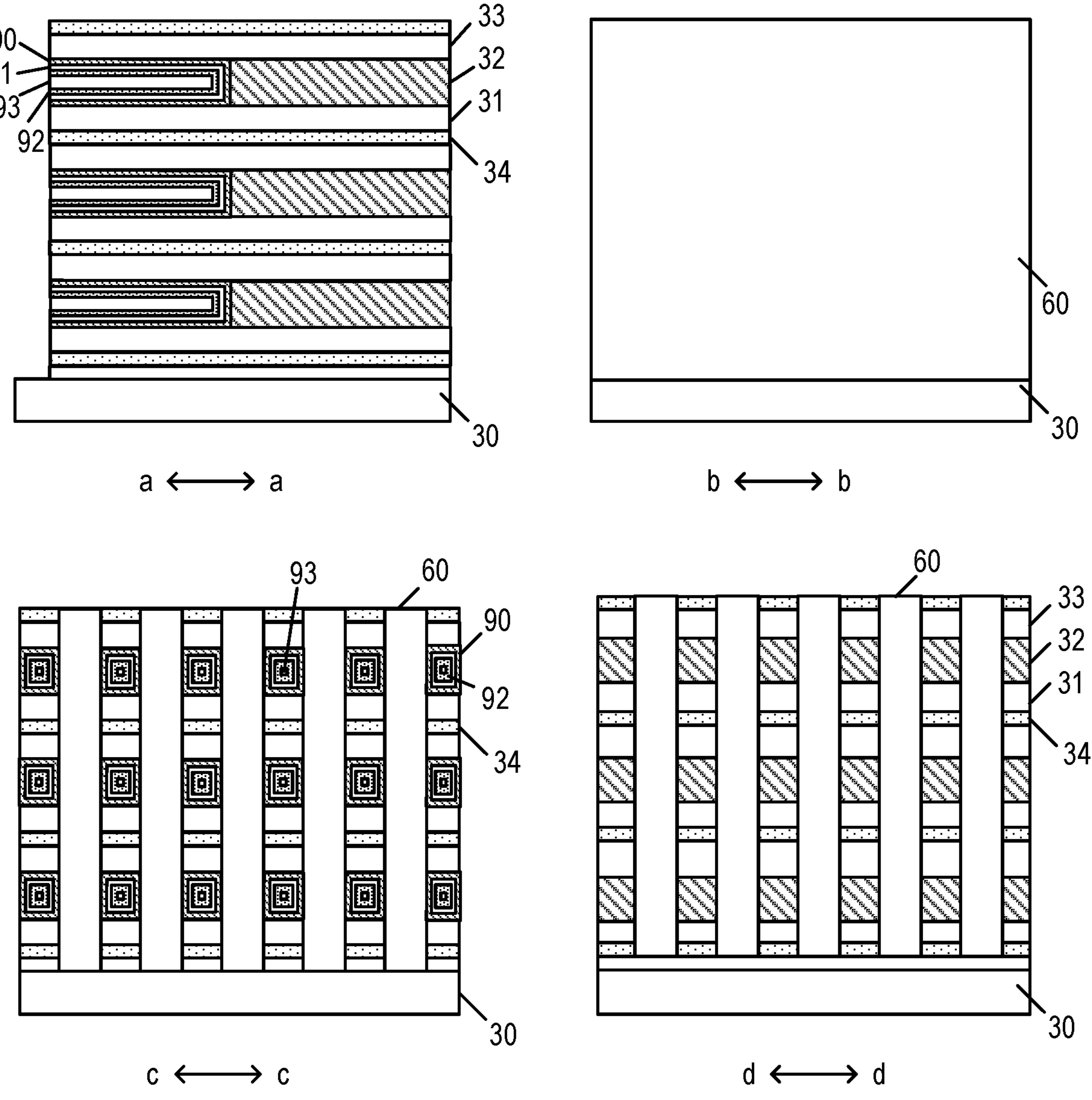

At S13, transistor structures are formed in the first trenches 80. As shown in FIG. 9, the transistor structures include gate layers 90 covering the inner walls of the first trenches 80, and active structures located in the gate layers 90.

In some embodiments, the active structures 92 are hollow structures. The operation in which the transistor structures are formed in the first trenches 80 includes the following operations.

The gate layers 90 covering the inner walls of the first trenches 80 are formed.

Gate dielectric layers 91 covering the inner walls of the gate layers 90 are formed.

The active structures 92 covering the inner walls of the gate dielectric layers 91 are formed in the first trenches 80. The active structures 92 include channel layers, and first active layers and second active layers that are distributed at opposite sides of the channel layers in the third direction D3.

As shown in FIG. 9, insulating filling layers 93 covering the inner walls of the active structures 92 and filling up the first trenches 80 are formed.

The active structures 92 being the hollow structures means that at least the channel layers of the active structures 92 have a hollow structure. In an embodiment, the first active layer act as one of a source region or a drain region, and the second active layer act as the other of the source region or the drain region.

Specifically, a conductive material such as TiN may be deposited in the first trenches 80 by a lateral atomic layer deposition process to form the gate layers 90 covering the entire inner walls of the first trenches 80. At this time, since the storage regions PM adjacent in the second direction D2 are isolated from each other by the isolation layers 60, gate layers 90 of two storage regions PM adjacent in the second direction D2 are also independent from each other (that is, gate layers 90 of two storage regions PM adjacent in the second direction D2 are also isolated from each other by the isolation layer 60). Thereafter, a dielectric material such as an oxide material (e.g., silicon dioxide) may be deposited in the first trenches 80 by a lateral atomic layer deposition process to form the gate dielectric layers 91 covering the entire surfaces of the gate layers 90. Then, the active structures 92 covering the surfaces of the gate dielectric layers 91 are formed in the first trenches 80. At this time, the active structures 92 do not fill up the first trenches 80. Thereafter, as shown in FIG. 9, an insulating dielectric material may be deposited in the first trenches 80 by a lateral atomic layer deposition process to form the insulating filling layers 93 covering the entire surfaces of the active structures 92 and filling up the first trenches 80. By forming the active structures 92 being hollow structures and filling up the hollow active structures 92 with the insulating filling layers 93 according to the embodiments, the transistor structures including the active structure 92 are capable of operating in a full depletion mode, thus it reduces parasitic bipolar junction transistor (BJT) and alleviates floating body effect (FBE), thereby improving the electrical performance of the semiconductor structure and improving the yield of semiconductor structures. In an embodiment, the electrical performance of the transistor structure may be adjusted by adjusting the thickness of the active structures 92 in the first direction D1 to satisfy different application requirements.

In some embodiments, the material of the insulating filling layers 93 is an oxide material. Because silicon dioxide has a good hole-filling property, in order to enable that the first trenches 80 can be filled up, in an embodiment, the material of the insulating filling layer 93 is silicon dioxide.

In some embodiments, the material of the active structures 92 is an oxide semiconductor material.

Specifically, the material of the active structures 92 is the oxide semiconductor material. The oxide semiconductor material is any one or a combination of two or more of indium oxide ($In_2O_3$), zinc oxide (ZnO), indium zinc oxide (IZO), indium gallium zinc oxide (IGZO), indium tin zinc oxide (IZTO), or zinc nitride oxide (ZnON). Preferably, the material of the active structures 92 is IGZO.

In order to further simplify the manufacturing process of the semiconductor structure and satisfy different semiconductor structure application requirements, in other embodiments, the active structures 92 are solid structures. The operation in which the transistor structures are formed in the first trenches 80 includes the following operations.

The gate layers 90 covering the inner walls of the first trenches 80 are formed.

Gate dielectric layers 91 covering the inner walls of the gate layers 90 are formed.

Figure 10:
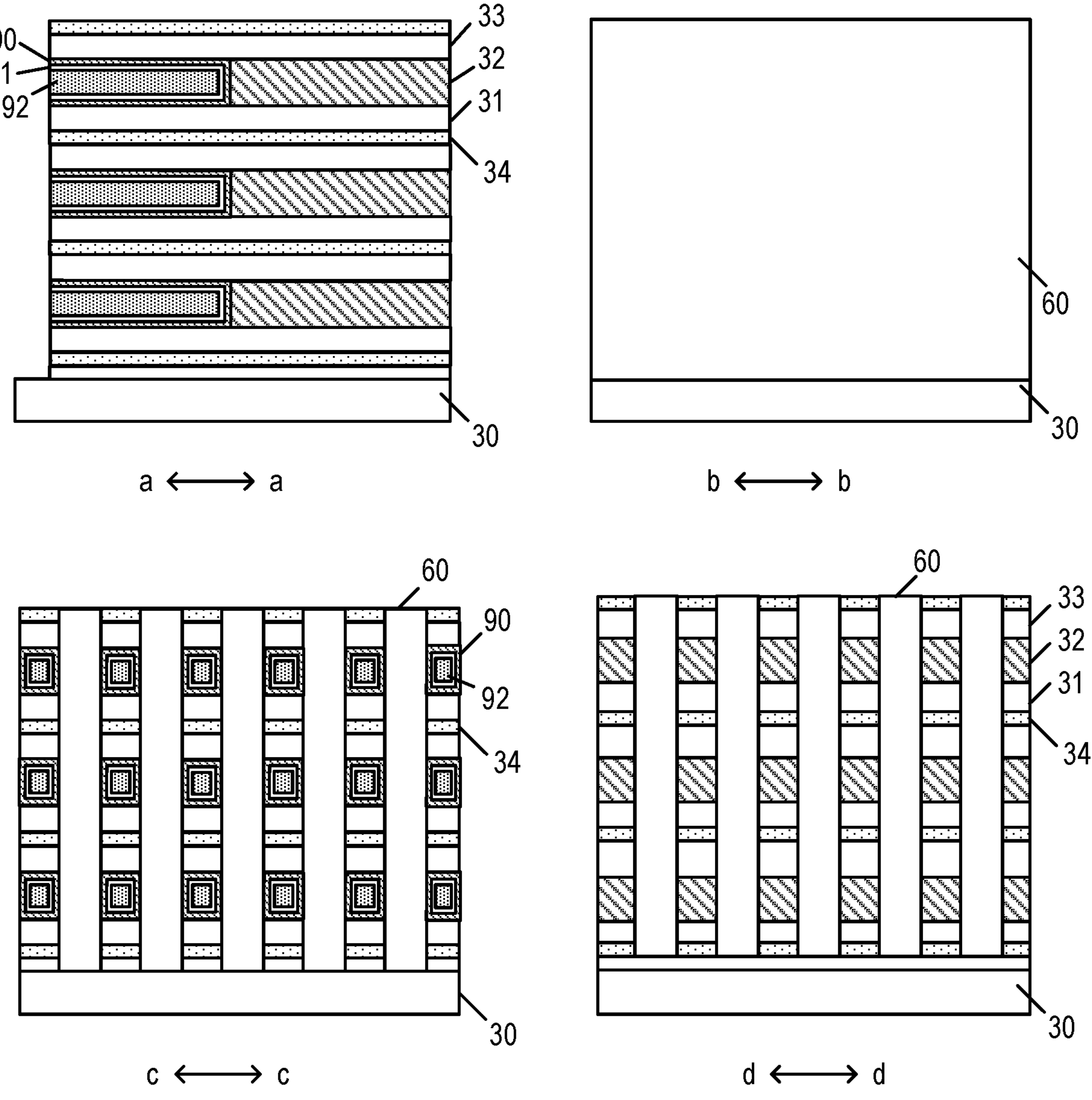

The active structures 92 covering the inner walls of the gate dielectric layers 91 and filling up the first trenches 80 are formed. As shown in FIG. 10, the active structures 92 include channel layers, and first active layers and second active layers distributed on opposite sides of the channel layers in the third direction D3.

The active structures 92 being solid structures means that at least the channel layers of the active structures 92 have a solid structure. In an embodiment, the channel layers, the first active layers and the second active layers of the active structures 92 each have a solid structure. Specifically, a conductive material such as TiN may be deposited in the first trenches 80 by a lateral atomic layer deposition process to form the gate layers 90 covering the entire inner walls of the first trenches 80. At this time, since the storage regions PM adjacent in the second direction D2 are isolated from each other by the isolation layers 60, gate layers 90 of two storage regions PM adjacent in the second direction D2 are also independent from each other (that is, gate layers 90 of two storage regions PM adjacent in the second direction D2 are also isolated from each other by the isolation layers 60). Thereafter, a dielectric material such as an oxide material (e.g., silicon dioxide) may be deposited in the first trenches 80 by a lateral atomic layer deposition process to form the gate dielectric layers 91 covering the entire surfaces of the gate layers 90. Then, as shown in FIG. 10, the active structures 92 covering the surfaces of the gate dielectric layers 91 and filling up the first trenches 80 are formed in the first trenches 80.

Figure 20:
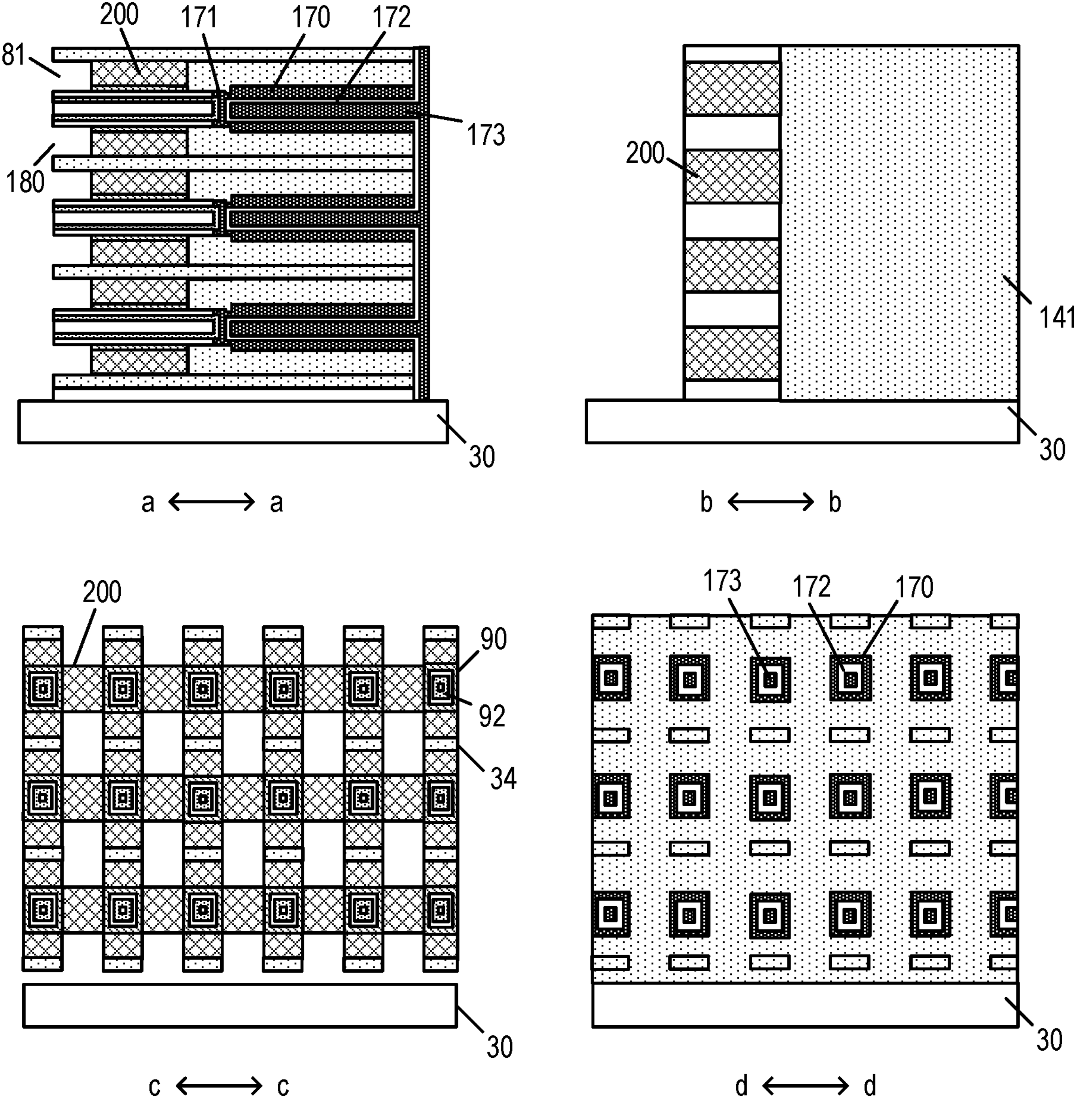

At S14, a word line 200 extending in the second direction D2 is formed. As shown in FIG. 2 and FIG. 20, the word line 200 envelops gate layers 90 of the plurality of storage regions PM arranged at intervals in the second direction D2.

In some embodiments, the storage regions PM also includes capacitor regions PC, the capacitor regions PC and the bit line regions PB are distributed at opposite sides of the transistor regions PB in the third direction D3. The gate layers 90 cover the entire inner walls of the first trenches 80. Prior to forming the word line 200 extending in the second direction D2, the method further includes the following operations.

The isolation layers 60 located between capacitor regions PC and the second active layers are removed to expose part of the isolation trenches 50. Sidewalls of the isolation trenches 50 expose the first sacrifice layers 31 and the third sacrifice layers 33.

Figure 12:
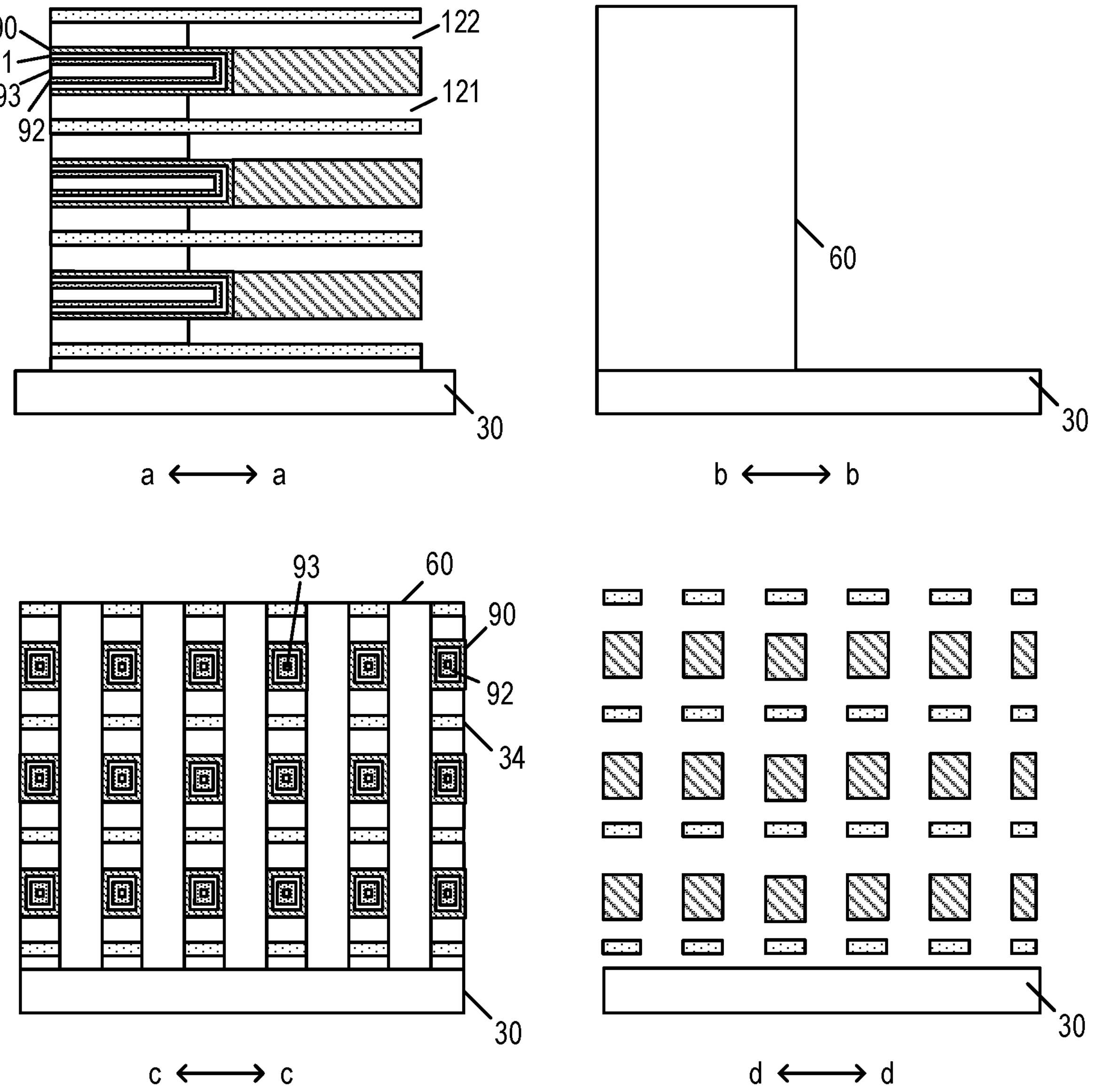

As shown in FIG. 12, the first sacrifice layers 31 and the third sacrifice layers 33 on the capacitor regions PC and on the second active layers are removed, and gate layers 90 on the second active layer are removed, to form second trenches 121 lower than the capacitor regions PC and the second active layers in the first direction D1, and to form third trenches 122 higher than the capacitor regions PC and the second active layers in the first direction D1 in the storage regions PM.

Figure 14:
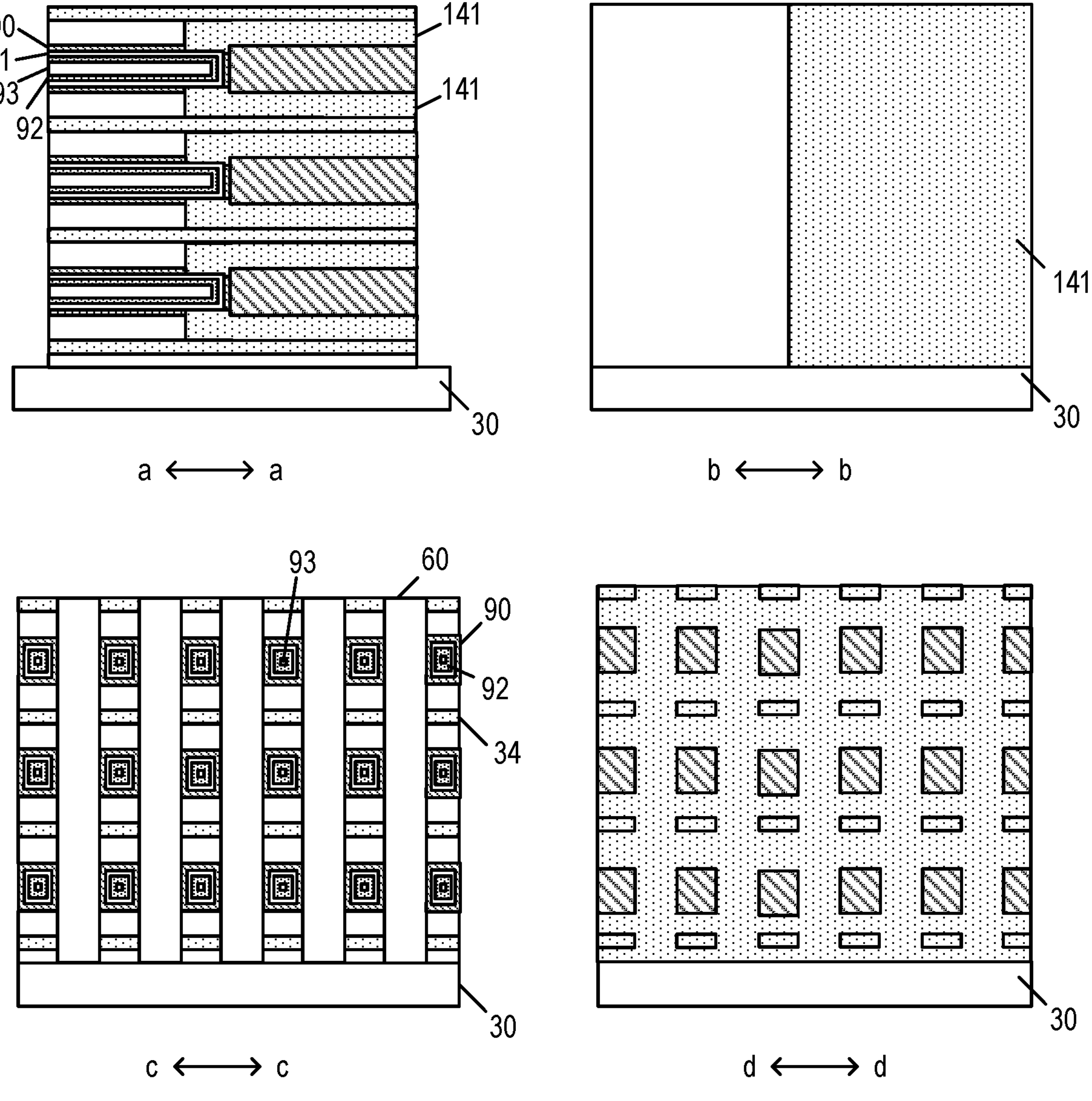

As shown in FIG. 14, first isolation layers 141 filling up second trenches 121, third trenches 122, and the isolation trenches 50 between the capacitor regions PC and the second active layers are formed.

Figure 11:
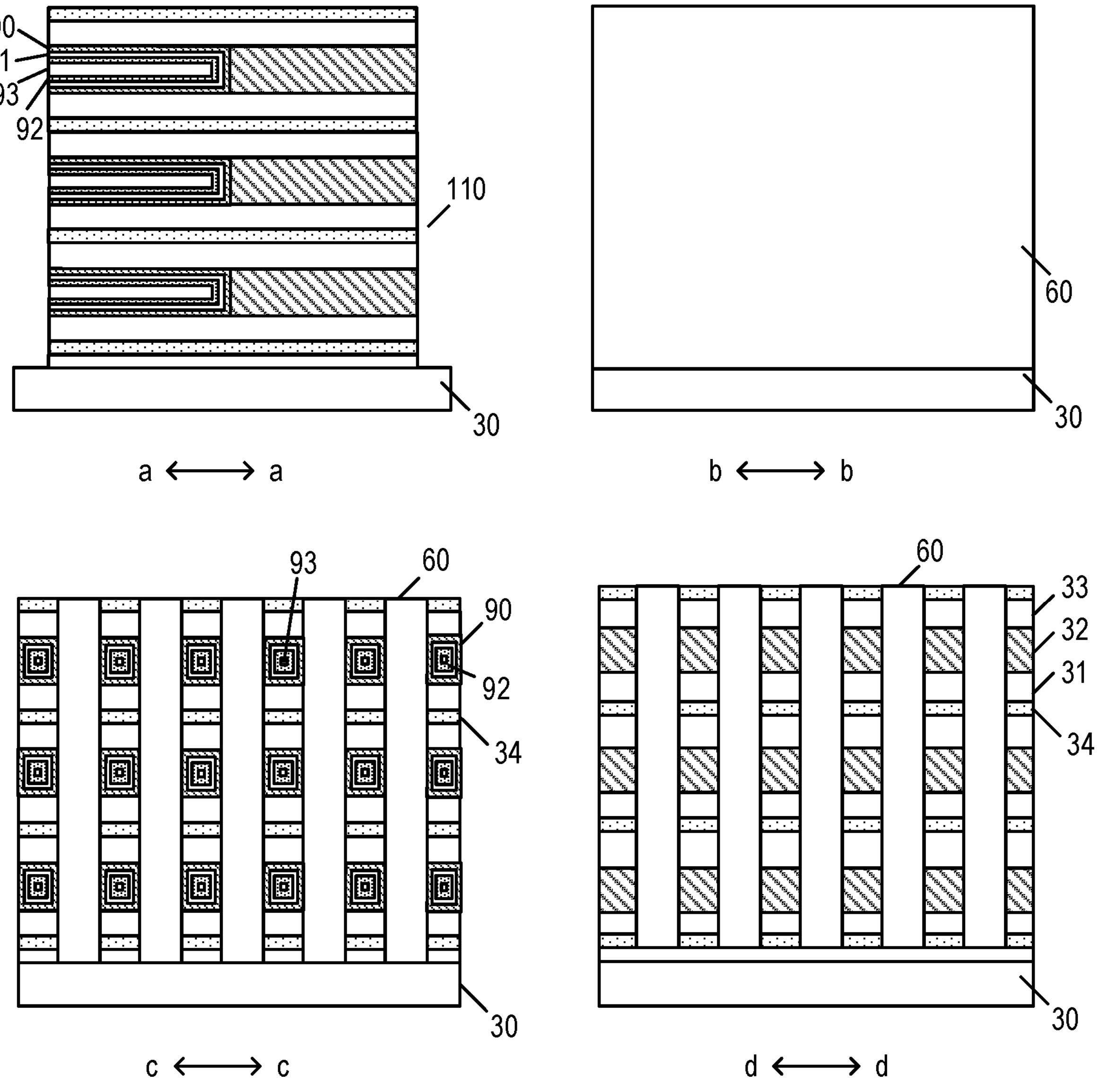
Figure 13:
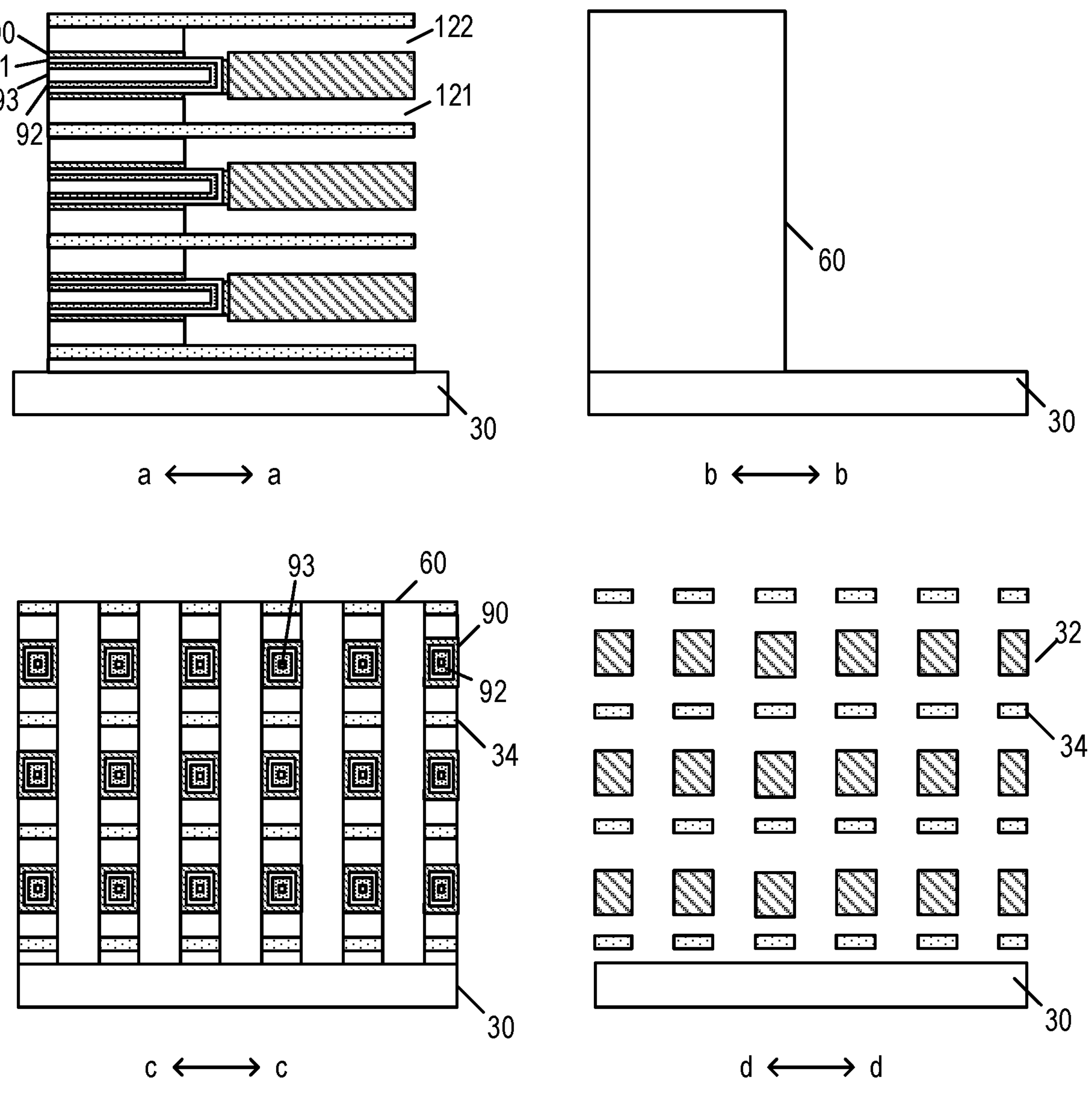

Specifically, as shown in FIG. 11, the stack at ends of the capacitor regions PC away from the transistor regions PB may be removed by a photolithography process to form etched trenches 110 exposing the substrate 30. Thereafter, the first sacrifice layers 31 and the third sacrifice layers 33 on the capacitor regions PC and on the second active layers may be removed along the etched trenches 110 by a lateral etching process, to form the second trenches 121 and the third trenches 122 in the storage regions PM and expose the part of the isolation trenches 50. As shown in FIG. 12, the second trenches 121 and the third trenches 122 are located at opposite sides of the second sacrifice layers 32 in the first direction D1, and the second trenches 121 are located below the third trenches 122. The second trenches 121 and the third trenches 122 expose the gate layers 90 on the second active layers. Then, as shown in FIG. 13, the gate layers 90 on the second active layers are removed along second trenches 121 and third trenches 122 to expose the gate dielectric layers 91 on the second active layers. Thereafter, as shown in FIG. 14, an insulating dielectric material such as a nitride (e.g., silicon nitride) is deposited in the second trenches 121 and the third trenches 122 to form the first isolation layers 141 filling up the second trenches 121, the third trenches 122, and the isolation trenches 50 between the capacitor regions and the second active layers.

In some embodiments, after the first isolation layers 141 filling up the second trenches 121, the third trenches 122, and the isolation trenches 50 between the capacitor regions PC and the second active layers are formed, the method further includes the following operations.

Figure 15:
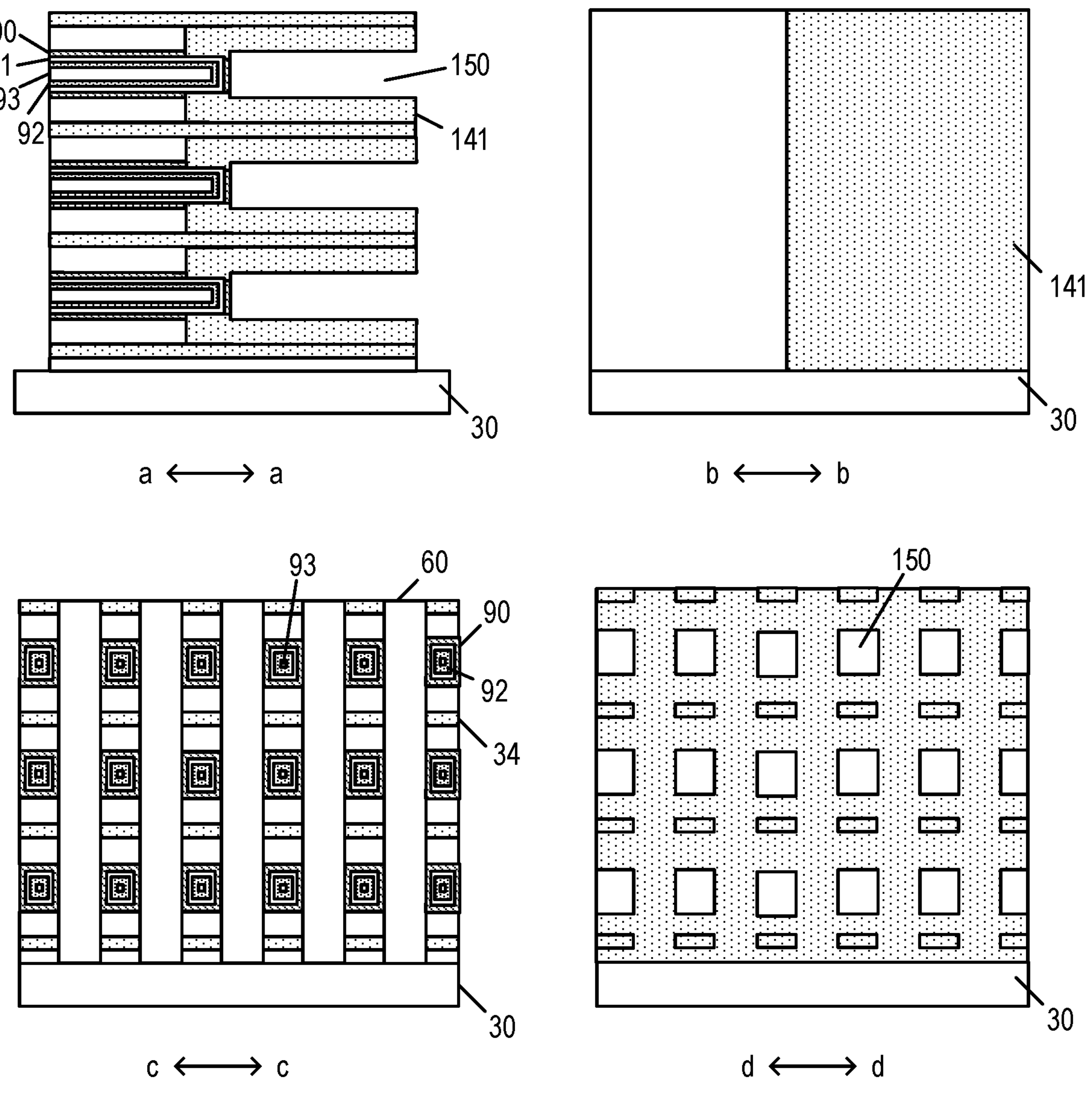

As shown in FIG. 15, the second sacrifice layers 32 of the capacitor regions PC are removed to form capacitor trenches 150 between the interlayer insulating layers 34.

Figure 16:
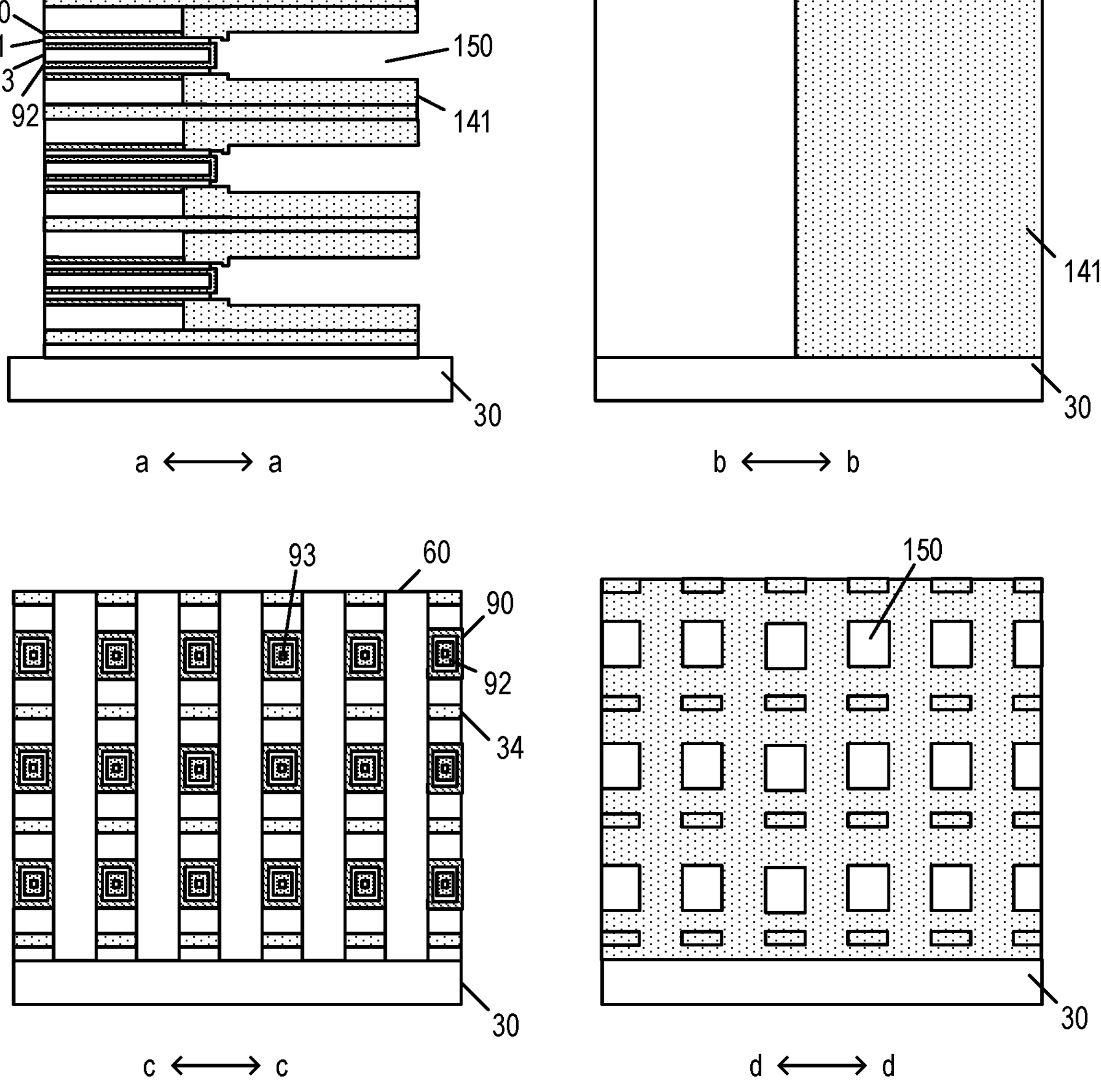

As shown in FIG. 16, the gate layers 90 exposed by the capacitor trenches 150 are removed to expose the second active layers.

Figure 17:
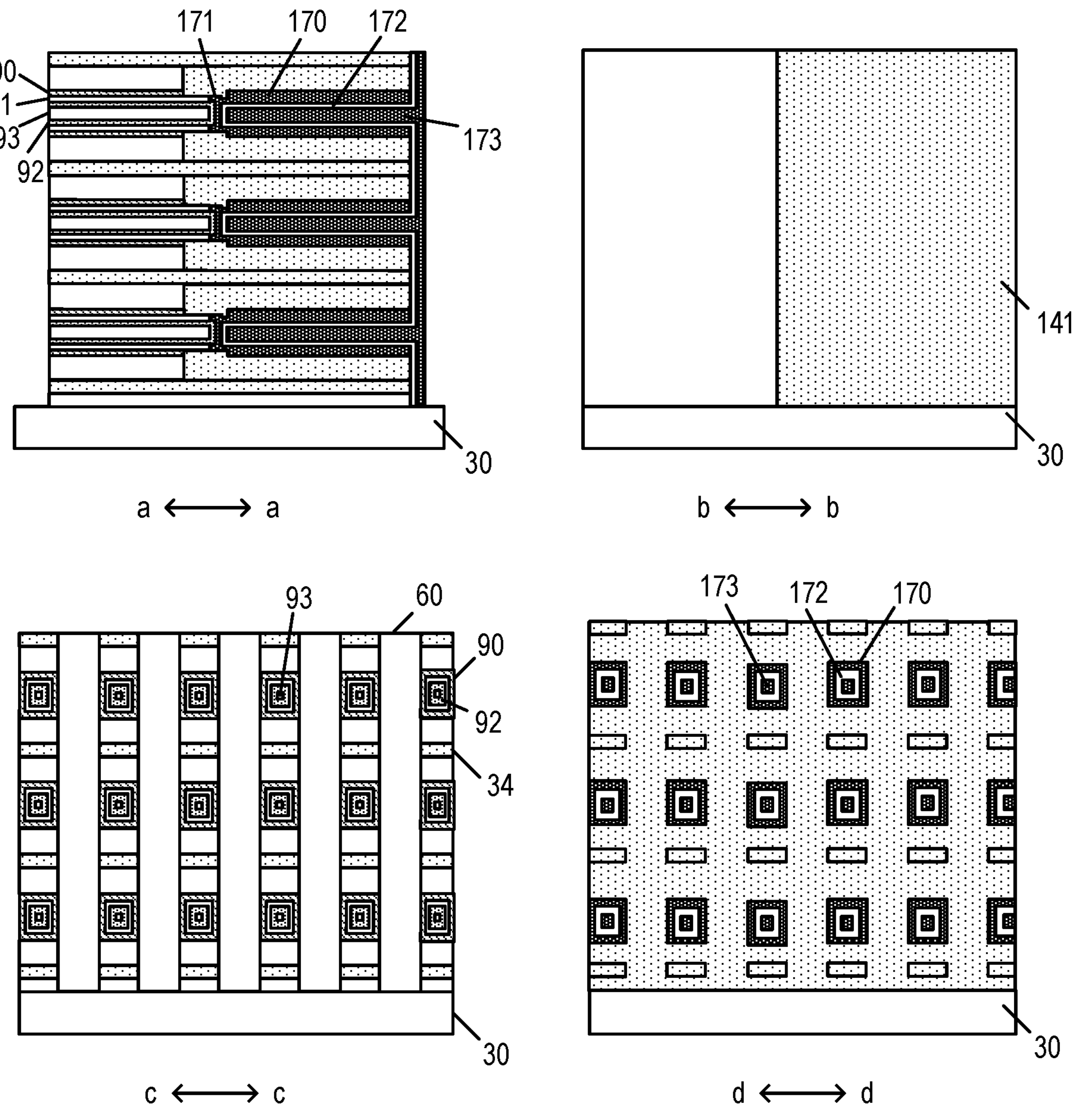

As shown in FIG. 2 and FIG. 17, capacitor structures 20 electrically connected to the second active layers are formed in the capacitor trenches 150.

Specifically, a capacitor structure 20 includes a lower electrode layer, a dielectric layer 172 and an upper electrode layer 173. For example, the second sacrifice layers 32 of the capacitor regions PC are removed along the etched trenches 110 to form the capacitor trenches 150 located between the first isolation layers 141 and second isolation layers 142. As shown in FIG. 15, the capacitor trenches 150 expose the gate layers 90 at ends of the active structures 92. As shown in FIG. 16, the gate layers 90 and the gate dielectric layers 91 located at the ends of the active structures 92 are removed along the capacitor trenches 150 to expose the second active layers of the active structures 92. Then, a conductive material such as TiN is deposited in the capacitor trenches 150 along the etched trenches 110 to form lower electrode layers that cover the inner walls of the capacitor trenches 150 and electrically connected to the second active layers in direct contact with the second active layers. A dielectric material having a high dielectric constant is deposited in the capacitor trenches 150 to form the dielectric layers 172 covering the surfaces of the lower electrode layers. As shown in FIG. 17, a conductive material such as TiN is deposited in the capacitor trenches 150 to form the upper electrode layers 173 covering the surfaces of the dielectric layers 172. In order to increase the contact area between the second active layer and the lower electrode layer, thereby reducing the contact resistance between the transistor structure and the capacitor structure 20, in an embodiment, the lower electrode layer includes a main body portion 170, and an extension portion 171 connected to the main body portion 170 in the third direction D3. The extension portion 171 covers the top surface of the second active layer and the bottom surface of the second active layer. The main body portion 170 covers the sidewall of the second active layer. The dielectric layer 172 covers the surface of the main body portion 170. The top surface and the bottom surface of the second active layer are distributed at opposite ends of the second active layer in the first direction D1.

In some embodiments, the specific operation in which the word line 200 extending in the second direction D2 is formed includes the following operations.

The isolation layers 60 between channel layers and first active layers are removed to expose part of the isolation trenches 50. Sidewalls of the isolation trenches 50 expose the first sacrifice layers 31 and the third sacrifice layers 33.

Figure 18:
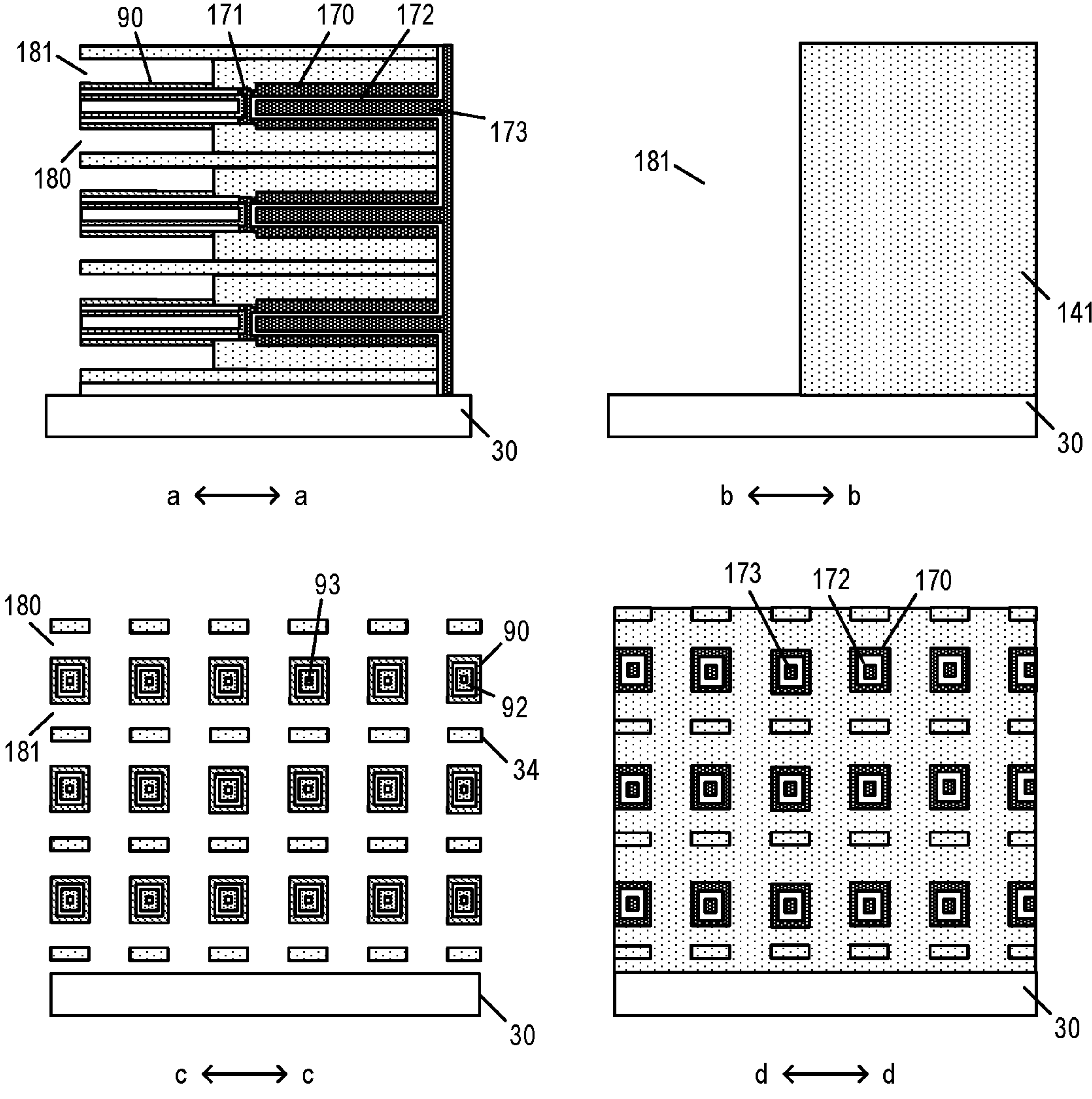

As shown in FIG. 18, the first sacrifice layers 31 and the third sacrifice layers 33 on the channel layers and on the first active layers are removed to form fourth trenches 180 below the channel layers and the first active layers in the first direction D1 and to form fifth trenches 181 above the channel layers and the first active layers in the first direction D1 in the storage regions PM.

Figure 19:
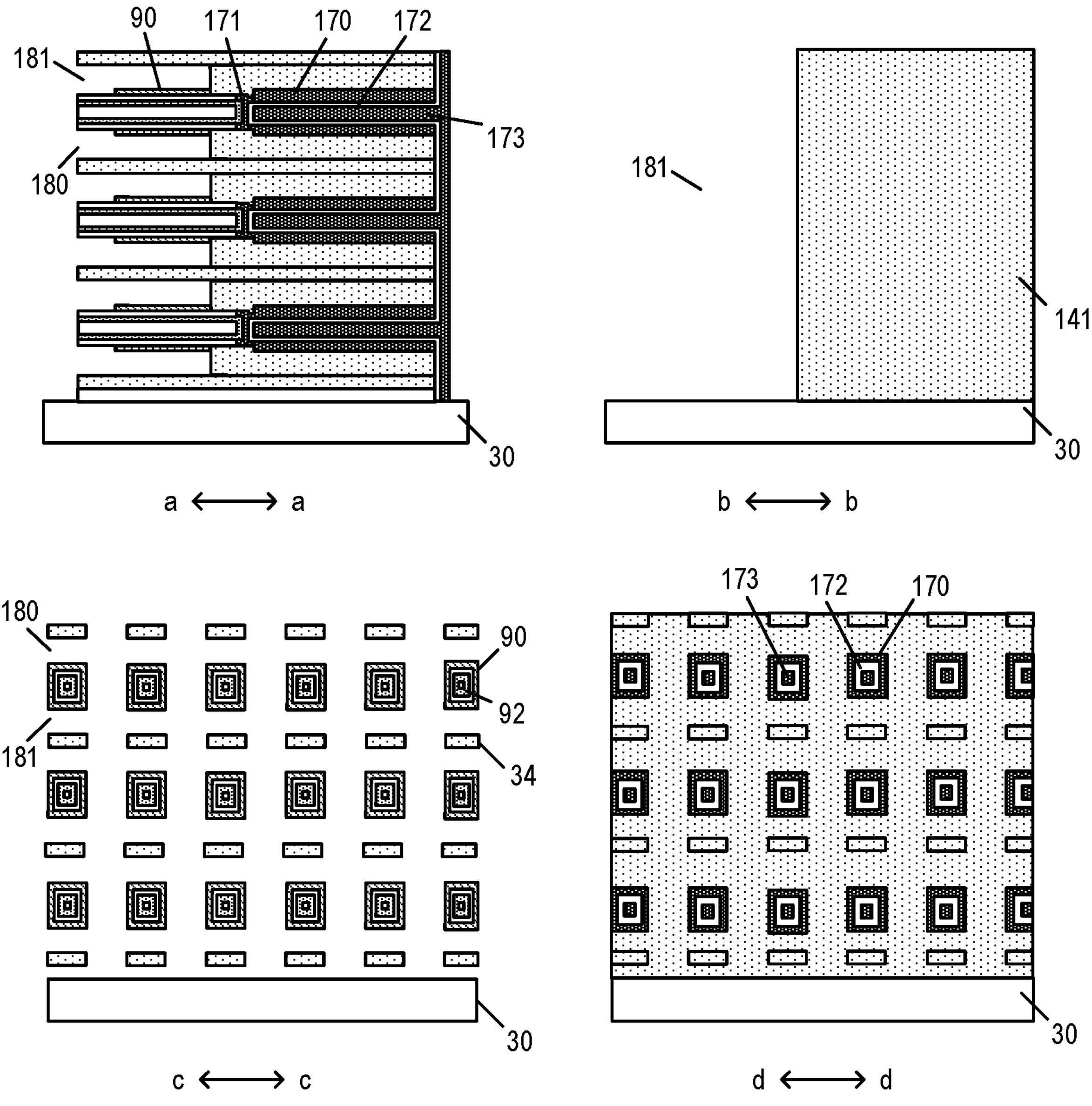

As shown in FIG. 19, the gate layers 90 on first active layers are removed along fourth trenches 180 and fifth trenches 181.

As shown in FIG. 20, a word line material is deposited along the fourth trenches 180 and the fifth trenches 181 to form the word line 200 extending in the second direction D2 and enveloping a plurality of gate layers 90 arranged at intervals in the second direction D2.

Specifically, as shown in FIG. 18, the first sacrifice layers 31 and the third sacrifice layers 33 retained in the transistor regions PB are removed (that is, the first sacrifice layers 31 and the third sacrifice layers 33 located on the channel layers and the first active layers are removed) along the bit line trenches 70, to form the fourth trenches 180 and the fifth trenches 181 exposing the gate layers 90 and to expose part of the isolation trenches 50. The fourth trench 180 and the fifth trench 181 are located on opposite sides of the active structure 92 along the first direction D1, and the fourth trench 180 is located below the fifth trench 181. As shown in FIG. 19, the gate layers 90 located on the first active layers are removed along the fourth trenches 180 and the fifth trenches 181 to expose the gate dielectric layers 91 on the first active layers. Thereafter, as shown in FIG. 2 and FIG. 20, the word line material is deposited along the fourth trenches 180 and the fifth trenches 181 to form the word line 200 extending in the second direction D2 and enveloping the plurality of gate layers 90 arranged at intervals in the second direction D2. According to the embodiments, after a plurality of independent gate layers 90 are formed, the word line 200 for connecting the plurality of gate layers 90 arranged at intervals in the second direction D2 is formed, which not only simplifies the forming process of the word line 200 having a horizontal structure, but also ensures a stable and sufficient contact connection between the word line 200 and the gate layers 90, thereby improving the stability of the electrical performance of the semiconductor structure.

In some embodiments, the operation in which the word line material is deposited along the fourth trenches 180 and the fifth trenches 181 includes the following operations.

The word line material is deposited along the fourth trenches 180 and the fifth trenches 181 by a selective atomic layer deposition process. The deposition rate of the word line material on the surfaces of the gate layers 90 is greater than the deposition rate of the word line material on the interlayer insulating layers 34. The word line material is filled at least in the fourth trenches 180 above the channel layers and the fifth trenches 181 below the channel layers.

Specifically, by selecting a suitable word line material, the deposition rate of the word line material on the surfaces of the gate layers 90 is greater than the deposition rate of that on the interlayer insulating layers 34, thereby ensuring that the formed word line 200 is connected to the plurality of gate layers 90 arranged at intervals in the second direction D2, while avoiding the connection between gate layers 90 arranged at intervals in the first direction D1 through the word line 200. That is, a horizontal word line structure is formed directly by the material selection, without controlling process parameters in the deposition process and without performing etching in the vertical direction, thereby simplifying the forming process of the horizontal word line 200, improving the manufacturing yield of semiconductor structures and reducing the manufacturing cost of the semiconductor structure. In an embodiment, the word line material is deposited only on the surfaces of the gate layers 90 and not on the surfaces of the interlayer insulating layers 34 and the surfaces of the gate dielectric layer 91.

In some embodiments, the material of the gate layers 90 is titanium nitride, the word line material is metal molybdenum, and the material of the interlayer insulating layers 34 is a nitride material (e.g., silicon nitride). The process condition for depositing the word line material includes: using molybdenum dichloride dioxide ($MoO_2Cl_2$) or molybdenum pentachloride ($MoCl_5$) as a precursor material, using ammonia or hydrogen as an auxiliary reaction gas, and the reaction temperature being between 450° C. and 600° C.

In some embodiments, after the word line 200 extending in the second direction D2 is formed, the method also includes the following operations.

Second isolation layers 210 are formed. The second isolation layers 210 are located in the fourth trenches 180 below the first active layers, the fifth trenches 181 above the second active layers, and the isolation trenches 50 between the channel layers and the first active layers.

Figure 22:
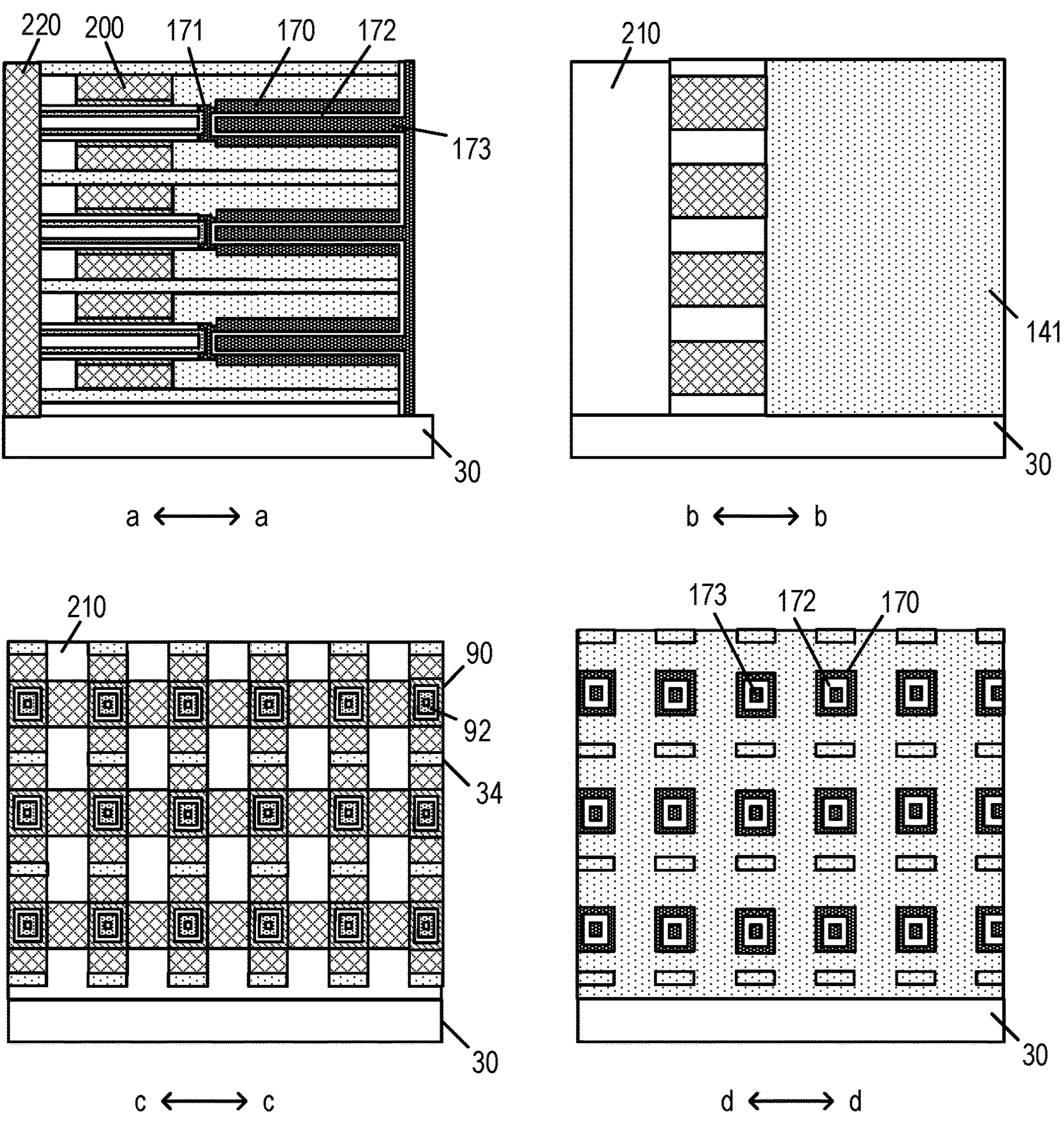

Bit lines 220 extending in the first direction D1 are formed in the bit line trenches 70. As shown in FIG. 2 and FIG. 22, the bit lines 220 are electrically connected to first active layers of transistor structures.

Figure 21:
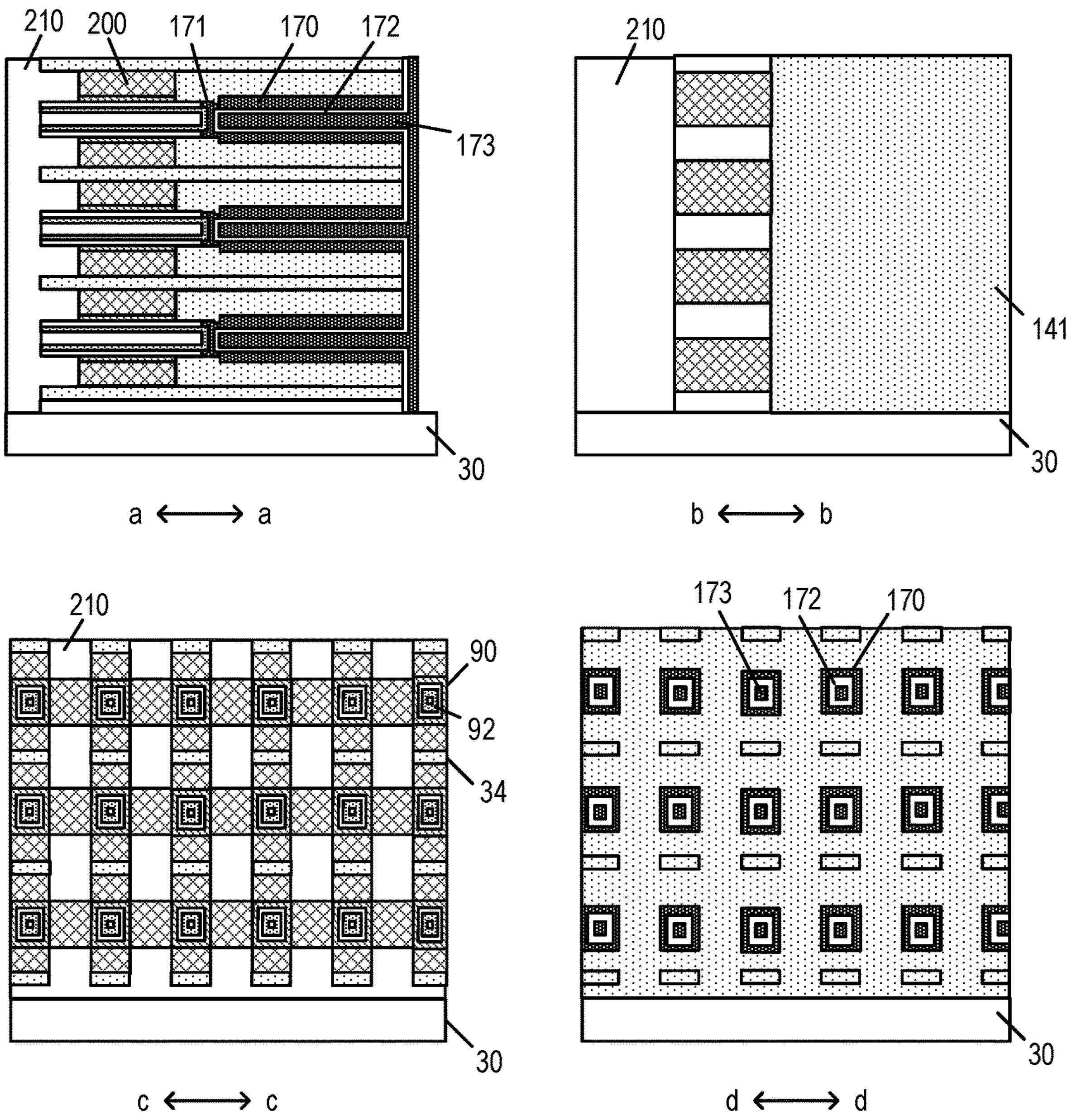

Specifically, as shown in FIG. 21, after the word line 200 is formed, the second isolation layers 210 are deposited in the fourth trenches 180, the fifth trenches 181 and the bit line trenches 70. In an embodiment, the second isolation layers 210 may be an oxide material (e.g., silicon dioxide). Thereafter, the second isolation layers 210 in the bit line trenches 70 are etched back, and a conductive material such as metal tungsten is filled in the bit line trenches 70 to form the bit lines 220 extending in the first direction D1. As shown in FIG. 2 and FIG. 22, the bit lines 220 are electrically connected to the first active layers of a plurality of storage regions PM arranged at intervals in the first direction D1.

The specific embodiments further provide a semiconductor structure, which may be formed by means of the method for forming a semiconductor structure shown in FIG. 1 to FIG. 22. The schematic diagrams of the semiconductor structure provided by the embodiments may be referred to FIG. 2 to FIG. 22. As shown in FIG. 2 to FIG. 22, the semiconductor structure includes a substrate 30, a stacked structure and a word line 200.

The stacked structure is located on the substrate 30. The stacked structure includes a plurality of memory units arranged at intervals in a first direction D1 and a second direction D2, and interlayer insulating layers 34 located between adjacent memory units in the first direction D1. The memory units include transistor structures, which include active structures 92, and gate layers 90 distributed around the peripheries of the active structures 92. The first direction D1 is perpendicular to the top surface of the substrate 30, and the second direction D2 is parallel to the top surface of the substrate 30.

The word line 200 extends in the second direction D2 and envelops gate layers 90 of a plurality of memory units arranged at intervals in the second direction D2.

The semiconductor structure formed according to the specific embodiment may be, but is not limited to a DRAM, and is described below by taking the semiconductor structure being the DRAM as an example. In the specific embodiment, the word line 200 and the gate layers 90 are formed in different process operations, that is, the gate layers 90 are formed first, and then the word line 200 is formed, so there are contact interfaces between the word line 200 and the gate layers 90. In the specific embodiment, by forming the gate layers 90 and the word line 200 in different operations, the word line 200 may envelop the gate layers 90 of the plurality of memory units arranged at intervals in the second direction D2, thus increasing the contact area between the word line 200 and the gate layers 90 while forming the word line 200 with a horizontal structure, thereby ensuring a stable connection between the word line 200 and the gate layers 90 and reducing the internal resistance of the semiconductor structure, moreover, the manufacturing process of the semiconductor structure is simplified, and the manufacturing cost of the semiconductor structure is reduced.

In some embodiments, the active structures 92 are solid structures; or, he active structures 92 are hollow structures.

In order to enable the transistor structures to operate in a full depletion mode, thereby reducing parasitic BJT and alleviating FBE, in some embodiments, the active structure 92 is the hollow structure, the active structure 92 includes a channel layer, and a first active layer and a second active layer located at opposite sides of the channel layer in a third direction D3. The third direction D3 is parallel to the top surface of the substrate 30. The transistor structure also includes an insulating filling layer 93.

The active structure 92 is distributed around the periphery of the insulating filling layer 93.

In order to further improve the performance of the transistor structure, in some embodiments, the thickness of the insulating filling layer 93 is greater than or equal to the thickness of the channel layer along the first direction D1.

In some embodiments, the material of the insulating filling layer 93 is an oxide material.

In some embodiments, the material of the gate layers 90 is titanium nitride, the material of the word line 200 is metal molybdenum, and the material of the interlayer insulating layers 34 is a nitride material.

Specifically, by selecting a suitable word line material for forming the word lines 200, the deposition rate of the word line material on the surfaces of the gate layers 90 is greater than the deposition rate on the interlayer insulating layers 34, thereby ensuring that the formed word line 200 is connected to a plurality of gate layers 90 arranged at intervals in the second direction D2, while avoiding the connection between the gate layers 90 arranged at intervals in the first direction D1 through the word lines 200. That is, the horizontal word line structure is formed directly by the material selection, without controlling process parameters in the deposition process and without performing etching in the vertical direction, thereby simplifying the forming process of the word line 200 having the horizontal structure, improving the manufacturing yield of semiconductor structures and reducing the manufacturing cost of the semiconductor structure.

In some embodiments, the memory units further include capacitor structures 20 located outside the transistor structures in the third direction D3. The capacitor structure 20 includes a lower electrode layer, a dielectric layer 172 and an upper electrode layer 173.

The lower electrode layer includes a main body portion 170 and an extension portion 171 connected to the main body portion 170 in the third direction D3. The extension portion covers the top surface and the bottom surface of the second active layer. The main body portion 170 covers the sidewall of the second active layer. The top surface of the second active layer and the bottom surface of the second active layer are distributed at opposite ends of the second active layer in the first direction D1.

The dielectric layer 172 covers the surface of the lower electrode layer.

The upper electrode layer 173 covers the surface of the dielectric layer 172.

Specifically, the extension portion 171 protrudes from the main body portion 170 in the third direction D3, such that the lower electrode layer including the extension portion 171 and the main body portion 170 covers the second active layer, thereby increasing the contact area between the lower electrode layer and the second active layer and reducing the contact resistance between the transistor structure and the capacitor structure.

In order to enable the later formed word line 200 to sufficiently cover the gate layers 900 and reduce the resistance of the word line 200, in some embodiments, the thickness of the word line 200 located on the top surfaces of the gate layers 90 or on the bottom surfaces of the gate layers 90 is greater than or equal to the thickness of the gate layers 90 in the first direction D1. The top surface of the gate layer 90 and the bottom surface of the gate layer 90 are oppositely distributed in the first direction D1. The bottom surface of the gate layer 90 refers to the surface of the gate layer 90 facing to the substrate 30.

In some embodiments, the material of the active structure 92 is an oxide semiconductor material.

According to the semiconductor structure and the method for forming the same provided by some embodiments of the specific embodiments, by firstly forming the transistor structures in the first trenches of the storage regions, in which the gate layers of the transistor structures are distributed around the peripheries of the active structure to form gate-all-around structures, and the gate layers in the storage regions are independent from each other, then forming the word line enveloping the gate layers of a plurality of storage regions arranged at intervals in the second direction, the need to form horizontal word lines while forming the gate layers by a complex process is eliminated, thereby simplifying the forming process of the horizontal word lines and reducing the manufacturing cost of the semiconductor structure. In addition, according to some embodiments of the specific embodiments, the stack is formed by depositing the sacrifice layers and the interlayer insulating layers, and then the active structures are formed by removing part of the sacrifice layers and performing the filling process at the positions of the sacrifice layers, thus the formation of the active structures does not need to adopt a complex epitaxial process, which not only further simplifies the manufacturing process of the semiconductor structure, but also reduces defects such as stress in the semiconductor structure, thereby improving the manufacturing yield and the electrical performance of the semiconductor structure. In addition, the active structures in some embodiments of the specific embodiment are hollow structures, and the interiors of the active structures are filled with the insulating filling layers, so that the transistor structures can work in the full depletion mode, thereby further improving the yield of semiconductor structures and improving the electrical performance of the semiconductor structure.

The foregoing is only preferred embodiments of the disclosure, and it should be noted that, some modifications and embellishments may be made to those of ordinary skill in the art without departing from the principle of the disclosure, and such modifications and embellishments also shall be considered as the protection scope of the disclosure.

What is claimed is:

1. A method for forming a semiconductor structure, comprising:

forming a stack on a substrate, wherein the stack comprises interlayer insulating layers and sacrifice layers alternately stacked in a first direction, the stack comprises a plurality of storage regions arranged at intervals in a second direction, the first direction is perpendicular to a top surface of the substrate, and the second direction is parallel to the top surface of the substrate;

forming first trenches located between adjacent interlayer insulating layers through removing part of the sacrifice layers of the storage regions;

forming transistor structures in the first trenches, wherein the transistor structures comprise gate layers covering inner walls of the first trenches and active structures located in the gate layers; and forming a word line extending in the second direction, wherein the word line envelops the gate layers of the plurality of storage regions arranged at intervals in the second direction;

wherein the operation of forming the stack on the substrate comprises;

providing the substrate; and alternately depositing the interlayer insulating layers and the sacrifice layers on the top surface of the substrate in the first direction, wherein the sacrifice layers comprise first sacrifice layers, second sacrifice layers and third sacrifice layers stacked in sequence in the first direction;

wherein before forming the first trenches between adjacent interlayer insulating layers, the method further comprises:

etching the stack to form isolation trenches located between the storage regions adjacent in the second direction; and forming isolation layers filling op the isolation trenches;

wherein the storage regions comprise transistor regions and bit line regions located at one side of the transistor regions in a third direction, wherein the third direction is parallel to the top surface of the substrate, and the second direction intersects with the third direction; the operation of forming the first trenches between adjacent interlayer insulating layers comprises:

removing the stack in the bit line regions to form bit line trenches; and removing the second sacrifice layers in the transistor regions along the bit line trenches to form the first trenches located between the first sacrifice layers and the third sacrifice layers in the transistor regions.

2. The method for forming a semiconductor structure according to claim 1, wherein a material of the first sacrifice layers and a material of the third sacrifice layers each are an oxide material, and a material of the second sacrifice layers is a polysilicon material.

3. The method for forming a semiconductor structure according to claim 1, wherein the active structures are hollow structures, and the operation of forming the transistor structures in the first trenches comprises:

forming the gate layers covering the inner walls of the first trenches;

forming gate dielectric layers covering inner walls of the gate layers;

forming the active structures covering inner walls of the gate dielectric layers in the first trenches, wherein the active structures comprise channel layers, first active layers and second active layers distributed at opposite sides of the channel layers in the third direction; and forming insulating filling layers covering inner walls of the active structures and filling up the first trenches;

or, wherein the active structures are solid structures, and the operation of forming the transistor structure in the first trenches comprises:

forming the gate layers covering the inner walls of the first trenches;

forming gate dielectric layers covering inner walls of the gate layers; and forming the active structures covering inner walls of the gate dielectric layers and filling up the first trenches, wherein the active structures comprise channel layers, first active layers and second active layers distributed at opposite sides of the channel layers in the third direction.

4. The method for forming a semiconductor structure according to claim 3, wherein the storage regions further comprise capacitor regions, the capacitor regions and the bit line regions are distributed at opposite sides of the transistor regions in the third direction, the gate layers cover the whole inner walls of the first trenches; wherein before forming the word line extending in the second direction, the method further comprises:

removing the isolation layers between the capacitor regions and the second active layers to expose part of the isolation trenches, wherein sidewalls of the isolation trenches expose the first sacrifice layers and the third sacrifice layers;

removing the first sacrifice layers and the third sacrifice layers on the capacitor regions and on the second active layers, and removing the gate layers on the second active layers, to form second trenches lower than the capacitor regions and the second active layers in the first direction and to form third trenches higher than the capacitor regions and the second active layers in the first direction in the storage regions; and forming first isolation layers filling up the second trenches, the third trenches and the isolation trenches between the capacitor regions and the second active layers.

5. The method for forming a semiconductor structure according to claim 4, wherein after forming the first isolation layers filling up the second trenches, the third trenches and the isolation trenches between the capacitor regions and the second active layers, the method further comprises:

removing the second sacrifice layers in the capacitor regions to form capacitor trenches between the interlayer insulating layers;

removing the gate layers exposed by the capacitor trenches to expose the second active layers; and forming capacitor structures electrically connected to the second active layers in the capacitor trenches.

6. The method for forming a semiconductor structure according to claim 3, wherein the specific operation of forming the word line extending in the second direction comprises:

removing the isolation layers between channel layers and first active layers to expose part of the isolation trenches, wherein sidewalls of the isolation trenches expose the first sacrifice layers and the third sacrifice layers;

removing the first sacrifice layers and the third sacrifice layers on the channel layers and on the first active layers to form fourth trenches below the channel layers and the first active layers in the first direction and to form fifth trenches above the channel layers and the first active layers in the first direction in the storage regions;

removing the gate layers on the first active layers along the fourth trenches and the fifth trenches; and depositing a word line material along the fourth trenches and the fifth trenches to form the word line extending in the second direction and enveloping a plurality of the gate layers arranged at intervals in the second direction.

7. The method for forming a semiconductor structure according to claim 6, wherein the operation of depositing the word line material along the fourth trenches and the fifth trenches comprises:

depositing the word line material along the fourth trenches and the fifth trenches by a selective atomic layer deposition process, wherein a deposition rate of the word line material on surfaces of the gate layers is greater than a deposition rate on the interlayer insulating layers; the word line material is filled at least in the fourth trenches above the channel layers and in the fifth trenches below the channel layers.

8. The method for forming a semiconductor structure according to claim 7, wherein a material of the gate layers is titanium nitride, the word line material is metal molybdenum, a material of the interlayer insulating layers is a nitride material, and a process condition for depositing the word line material comprises: using molybdenum dichloride dioxide $MoO_2Cl_2$ or molybdenum pentachloride $MoCl_5$ as a precursor material, using ammonia or hydrogen as an auxiliary reaction gas, and a reaction temperature being between 450° C. and 600° C.

9. The method for forming a semiconductor structure according to claim 7, wherein after forming the word line extending in the second direction, the method further comprises:

forming second isolation layers, wherein the second isolation layers are located in the fourth trenches below the first active layers, the fifth trenches above the second active layers and the isolation trenches between the channel layers and the first active layers; and forming bit lines extending in the first direction in the bit line trenches, and the bit lines are electrically connected to first active layers of the transistor structures.

10. The method for forming a semiconductor structure according to claim 1, wherein a material of the active structures is an oxide semiconductor material.

11. A semiconductor structure, comprising:

a substrate;

a stacked structure located on the substrate, the stacked structure comprising a plurality of memory units arranged at intervals in a first direction and in a second direction, and interlayer insulating layers located between adjacent memory units in the first direction, the memory units comprising transistor structures, the transistor structures comprising active structures, and gate layers distributed around peripheries of the active structures, wherein the first direction is perpendicular to a top surface of the substrate, the second direction is parallel to the top surface of the substrate; and a word line extending in the second direction, the word line enveloping gate layers of a plurality of memory units arranged at intervals in the second direction;

wherein a thickness of the word line located on top surfaces of the gate layers or on bottom surfaces of the gate layers is greater than or equal to a thickness of the gate layers in the first direction.

12. The semiconductor structure of claim 11, wherein the active structures are solid structures; or the active structures are hollow structures.

13. The semiconductor structure according to claim 12, wherein the active structure are hollow structures; the active structures comprise channel layers, and first active layers and second active layers located on opposite sides of the channel layers in a third direction, the third direction is parallel to the top surface of the substrate; the transistor structures further comprise:

insulating filling layers, the active structures being distributed around peripheries of the insulating filling layers;

wherein a thickness of the insulating filling layers is greater than or equal to a thickness of the channel layers in the first direction.

14. The semiconductor structure according to claim 13, wherein the memory units further comprise capacitor structures located outside the transistor structures in the third direction; the capacitor structures comprise:

lower electrode layers comprising main body portions and extension portions connected to the main body portions in the third direction, the extension portions covering top surfaces of the second active layers and bottom surfaces of the second active layers, the main body portions covering sidewalls of the second active layers, and the top surfaces of the second active layers and the bottom surfaces of the second active layers being distributed at opposite ends of the second active layers in the first direction;

dielectric layers covering surfaces of the lower electrode layers; and upper electrode layers covering surfaces of the dielectric layers.

15. The semiconductor structure according to claim 11, wherein a material of the gate layers is titanium nitride, a material of the word line is metal molybdenum, and a material of the interlayer insulating layers is a nitride material.

16. The semiconductor structure according to claim 11, wherein a material of the active structures is an oxide semiconductor material.

* * * * *